(12) United States Patent
Noda

(10) Patent No.: US 10,505,113 B2
(45) Date of Patent: Dec. 10, 2019

(54) SEMICONDUCTOR MEMORY DEVICE AND METHOD FOR MANUFACTURING SAME

(71) Applicant: Toshiba Memory Corporation, Minato-ku (JP)

(72) Inventor: Kotaro Noda, Mie-ken (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/191,618

(22) Filed: Nov. 15, 2018

(65) Prior Publication Data

US 2019/0103557 A1 Apr. 4, 2019

Related U.S. Application Data

(60) Continuation of application No. 15/922,005, filed on Mar. 15, 2018, now Pat. No. 10,147,878, which is a continuation of application No. 15/392,399, filed on Dec. 28, 2016, now Pat. No. 9,954,168, which is a division of application No. 13/939,738, filed on Jul. 11, 2013, now Pat. No. 9,583,538.

(Continued)

(51) Int. Cl.
*H01L 45/00* (2006.01)
*H01L 27/24* (2006.01)

(52) U.S. Cl.
CPC ...... *H01L 45/1675* (2013.01); *H01L 27/2409* (2013.01); *H01L 27/2481* (2013.01); *H01L 45/085* (2013.01); *H01L 45/1233* (2013.01); *H01L 45/1266* (2013.01); *H01L 45/146* (2013.01); *H01L 45/148* (2013.01); *H01L 45/04* (2013.01)

(58) Field of Classification Search
CPC ....................................................... H01L 45/00
See application file for complete search history.

(56) References Cited

U.S. PATENT DOCUMENTS

2005/0130414 A1 6/2005 Choi et al.
2005/0199925 A1 9/2005 Kajiyama et al.
(Continued)

FOREIGN PATENT DOCUMENTS

| JP | 2010-161137 | 7/2010 |
|---|---|---|
| JP | 2010-225888 | 10/2010 |
| JP | 2011-129737 | 6/2011 |

*Primary Examiner* — Kenneth Parker
*Assistant Examiner* — Long H Le
(74) *Attorney, Agent, or Firm* — Oblon, McClelland, Maier & Neustadt, L.L.P.

(57) ABSTRACT

According to one embodiment, a semiconductor memory device includes a plurality of first interconnects extending in a first direction, a plurality of second interconnects extending in a second direction, a plurality of stacked films respectively provided between the first interconnects and the second interconnects, each of the plurality of stacked films including a variable resistance film, a first inter-layer insulating film provided in a first region between the stacked films, and a second inter-layer insulating film provided in a second region having a wider width than the first region. The second inter-layer insulating film includes a plurality of protrusions configured to support one portion of the plurality of second interconnects on the second region. A protruding length of the protrusions is less than a stacking height of the stacked films.

20 Claims, 22 Drawing Sheets

Related U.S. Application Data

(60) Provisional application No. 61/770,520, filed on Feb. 28, 2013.

(56) References Cited

U.S. PATENT DOCUMENTS

| | | | |
|---|---|---|---|
| 2005/0259464 A1 | 11/2005 | Kajiyama et al. | |
| 2006/0250836 A1* | 11/2006 | Herner | G11C 11/5685 |
| | | | 365/148 |
| 2007/0020799 A1 | 1/2007 | Choi et al. | |
| 2007/0284656 A1* | 12/2007 | Radigan | H01L 27/1021 |
| | | | 257/328 |
| 2008/0296603 A1 | 12/2008 | Chu | |
| 2008/0303155 A1 | 12/2008 | Lu | |
| 2010/0032640 A1 | 2/2010 | Xu | |
| 2010/0108976 A1* | 5/2010 | Jayasekara | B82Y 10/00 |
| | | | 257/4 |
| 2010/0117049 A1 | 5/2010 | Lung | |
| 2011/0068318 A1 | 3/2011 | Ishibashi et al. | |
| 2012/0241760 A1 | 9/2012 | Okabe | |
| 2013/0137237 A1 | 5/2013 | Ishibashi et al. | |

* cited by examiner

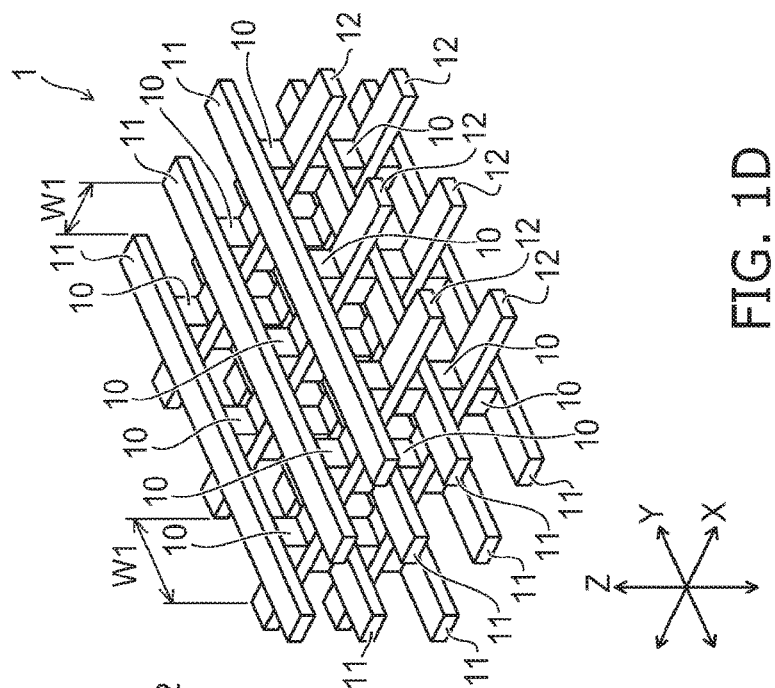
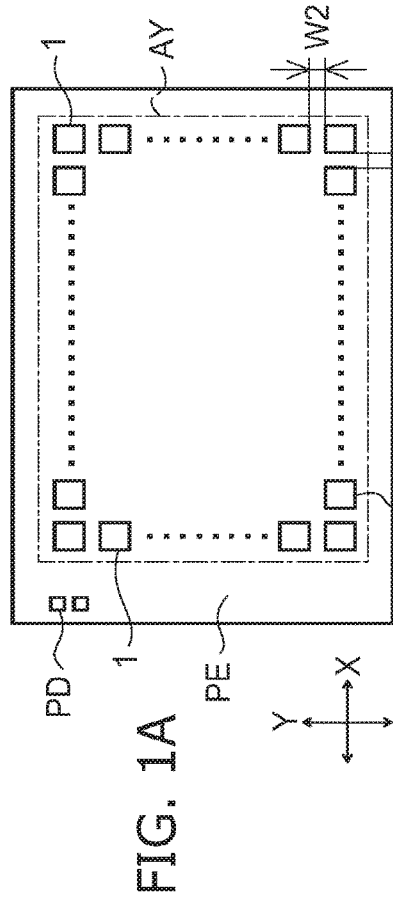
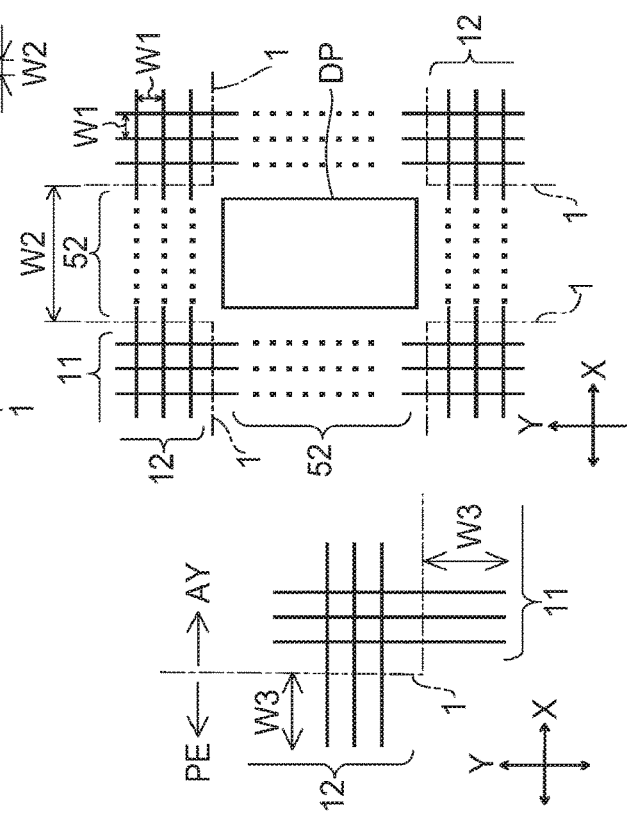
FIG. 1A
FIG. 1B
FIG. 1C
FIG. 1D

SEMICONDUCTOR MEMORY DEVICE AND METHOD FOR MANUFACTURING SAME

CROSS-REFERENCE TO RELATED APPLICATION

This application is a continuation of and claims the benefit of priority under 35 U.S.C. § 120 from U.S. application Ser. No. 15/922,005 filed Mar. 15, 2018, which is a continuation of U.S. application Ser. No. 15/392,399 filed Dec. 28, 2016 (now U.S. Pat. No. 9,954,168 issued Apr. 24, 2018), which is a division of U.S. application Ser. No. 13/939,738 filed Jul. 11, 2013 (now U.S. Pat. No. 9,583,538 issued Feb. 28, 2017), and claims the benefit of priority from U.S. Provisional Application 61/770,520 filed Feb. 28, 2013; the entire contents of each of which are incorporated herein by reference.

FIELD

Embodiments described herein relate generally to a semiconductor memory device and a method for manufacturing the same.

BACKGROUND

A cross-point memory that includes lower layer interconnects, upper layer interconnects that three-dimensionally cross the lower layer interconnects, and memory cells provided between the upper layer interconnects and the lower layer interconnects at the intersections between the upper layer interconnects and the lower layer interconnects has been proposed.

Generally, after stacking a stacked film including the memory cell on the lower layer interconnect, the stacked film and the lower layer interconnect are patterned into line configurations. After filling an inter-layer insulating film into the trenches between the stacked films that are made by the patterning, the upper layer interconnect is formed on the stacked films and on the inter-layer insulating film. Then, the stacked films including the memory cells and have columnar configurations are formed at the intersections between the upper layer interconnects and the lower layer interconnects by patterning the upper layer interconnect into line configurations and by further patterning the stacked films under the spaces between the upper layer interconnects patterned into the line configurations.

BRIEF DESCRIPTION OF THE DRAWINGS

FIGS. 1A to 1D are examples of schematic views of a semiconductor memory device of an embodiment;

DETAILED DESCRIPTION

Figure 2A:
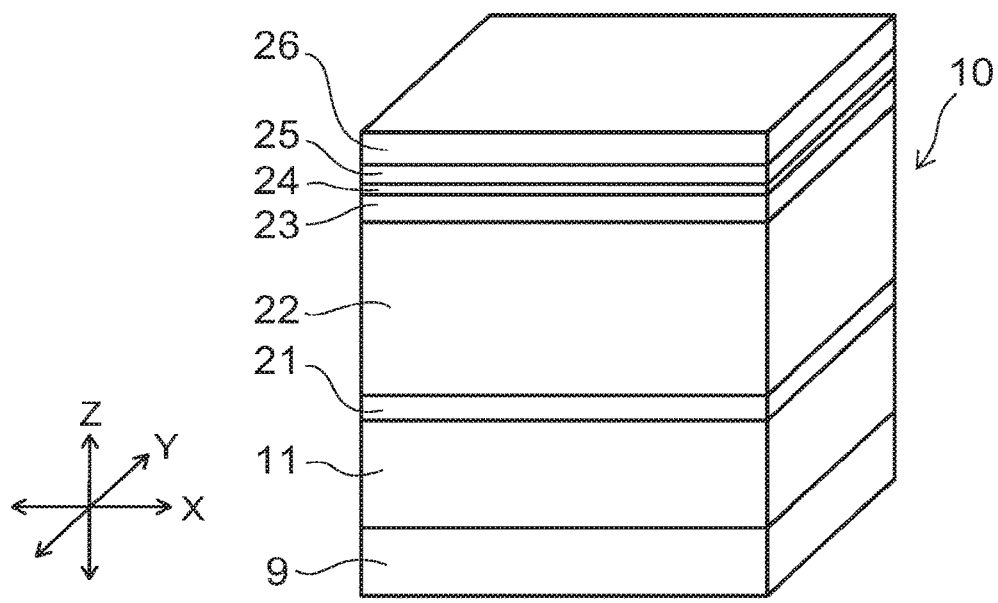
FIGS. 2A to 2B are perspective views showing an early step in a method for manufacturing a semiconductor memory device of a first embodiment.

According to one embodiment, a semiconductor memory device includes a plurality of first interconnects extending in a first direction, a plurality of second interconnects extending in a second direction crossing the first direction above the first interconnects, a plurality of stacked films respectively provided between the first interconnects and the second interconnects at portions where the first interconnects and the second interconnects cross each other, each of the plurality of stacked films including a variable resistance film, a first inter-layer insulating film provided in a first region between the stacked films, and a second inter-layer insulating film provided in a second region having a wider width than the first region. The second inter-layer insulating film includes a plurality of protrusions configured to support one portion of the plurality of second interconnects on the second region. A protruding length of the protrusions is less than a stacking height of the stacked films.

Embodiments will now be described with reference to the drawings. Similar components in the drawings are marked with like reference numerals.

FIG. 1A to FIG. 1D are examples of schematic views of a semiconductor memory device of the embodiment.

The semiconductor memory device includes a peripheral portion PE and a cell portion AY. The peripheral portion PE is disposed to surround the cell portion AY. A logic circuit that controls the cell portion AY, etc., are disposed in the peripheral portion PE. Also, electrode pads PD which data is passed to the outside can be provided in the peripheral portion PE.

Multiple memory cell arrays 1 are disposed in a matrix configuration in the cell portion AY. The memory cell array 1 includes multiple first interconnects 11 and multiple second interconnects 12. Further, the memory cell array 1 includes multiple stacked films 10 having substantially columnar configurations (hereinafter, called simply "columnar configurations") provided between the first interconnects 11 and the second interconnects 12.

The first interconnects 11 and the second interconnects 12 cross each other three-dimensionally to be non-parallel. For example, the first interconnects 11 extend in a first direction (a Y direction); the second interconnects 12 extend in a second direction (an X direction) orthogonal to the first direction; and the first interconnects 11 and the second interconnects 12 are orthogonal to each other. Each of the multiple stacked films 10 is provided at a cross point where the first interconnects 11 and the second interconnects 12 cross each other.

The multiple stacked films 10 are disposed in two-dimensional directions (XY directions) in, for example, a matrix configuration; and an array having the matrix configuration is multiply stacked in a third direction (a Z direction) orthogonal to the XY plane.

FIG. 1D shows, for example, a portion in which 4 layers of an array of 3 rows by 3 columns are stacked.

The first interconnect 11 is shared by the stacked films 10 on and under the first interconnect 11. Similarly, the second interconnect 12 is shared by the stacked films 10 on and under the second interconnect 12.

Here, FIG. 1B is an enlarged view between the memory cell arrays 1. As shown in FIG. 1B, the first interconnects 11 and the second interconnects 12 extend from each of the memory cell arrays 1. Also, the first interconnects 11 and the second interconnects 12 are connected between adjacent memory cell arrays 1. The region between the memory cell arrays 1 is taken as a second region 52.

Contacts can be connected to the first interconnects 11 and the second interconnects 12 in the second region 52. Although the first interconnects 11 and the second interconnects 12 appear to extend linearly between the adjacent memory cell arrays 1 in FIG. 1B, the first interconnects 11 and the second interconnects 12 may be bent to connect the contacts. Further, a dummy pattern DP may be disposed at each portion where the corners of the memory cell arrays 1 oppose each other.

The stacked films 10 are not provided in the second region 52. Further, a width W2 (the X-direction width and the Y-direction width) of the second region is wider than a width W1 (the X-direction width and the Y-direction width) of a first region between the stacked films 10 that have the columnar configurations.

Similarly, the stacked films 10 basically are not disposed in the peripheral region PE. There are cases where a portion of the stacked films 10 is disposed in the peripheral region PE as a ROM region. FIG. 1C is an enlarged view of the boundary vicinity of the memory cell array 1 and the peripheral region PE. As shown in FIG. 1C, the first interconnects 11 and the second interconnects 12 extend into the peripheral region PE from the memory cell array 1. Here, a distance W3 to the ends of the first interconnects 11 extending from the memory cell array 1 is greater than the width W1 (the X-direction width and the Y-direction width) of the first region between the stacked films 10 that have the columnar configurations.

Here, the memory cell arrays 1 disposed in the cell portion AY have substantially the same configuration. Therefore, it appears as though a unit in which the multiple stacked films 10 are disposed exists multiply in the cell portion AY. Here, it can be said that the boundary of the memory cell array 1 is the line connecting the outermost stacked films 10 of the unit.

Figure 6A:
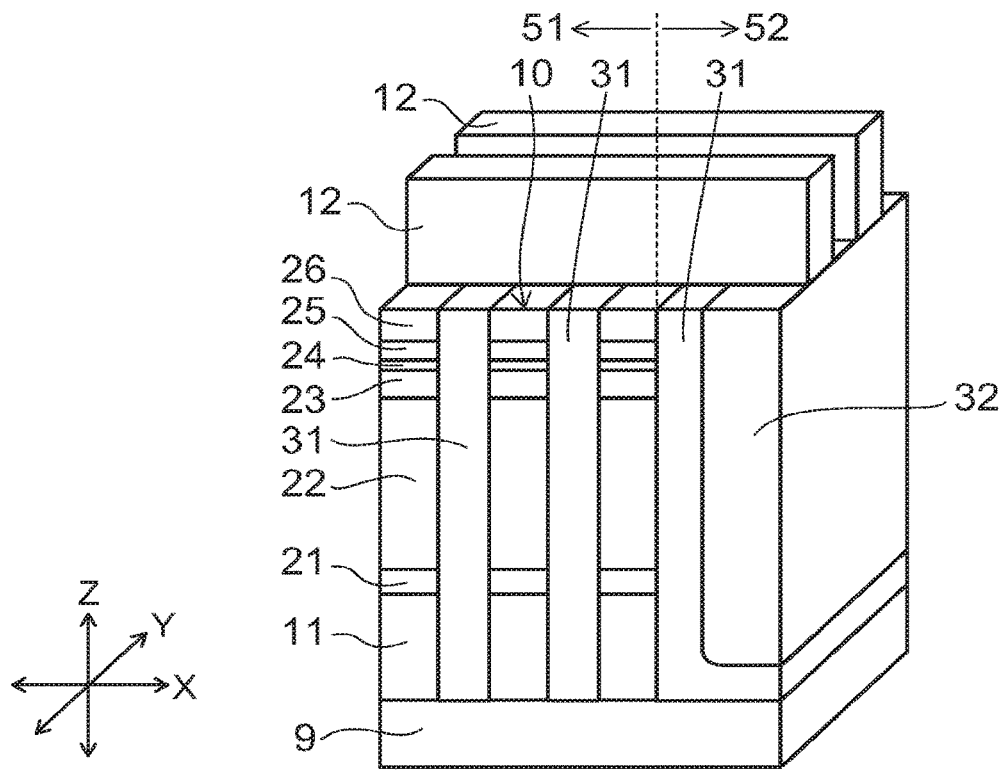
FIGS. 6A to 6B are perspective views showing further successive steps in the method for manufacturing a semiconductor memory device of the first embodiment.
Figure 6B:
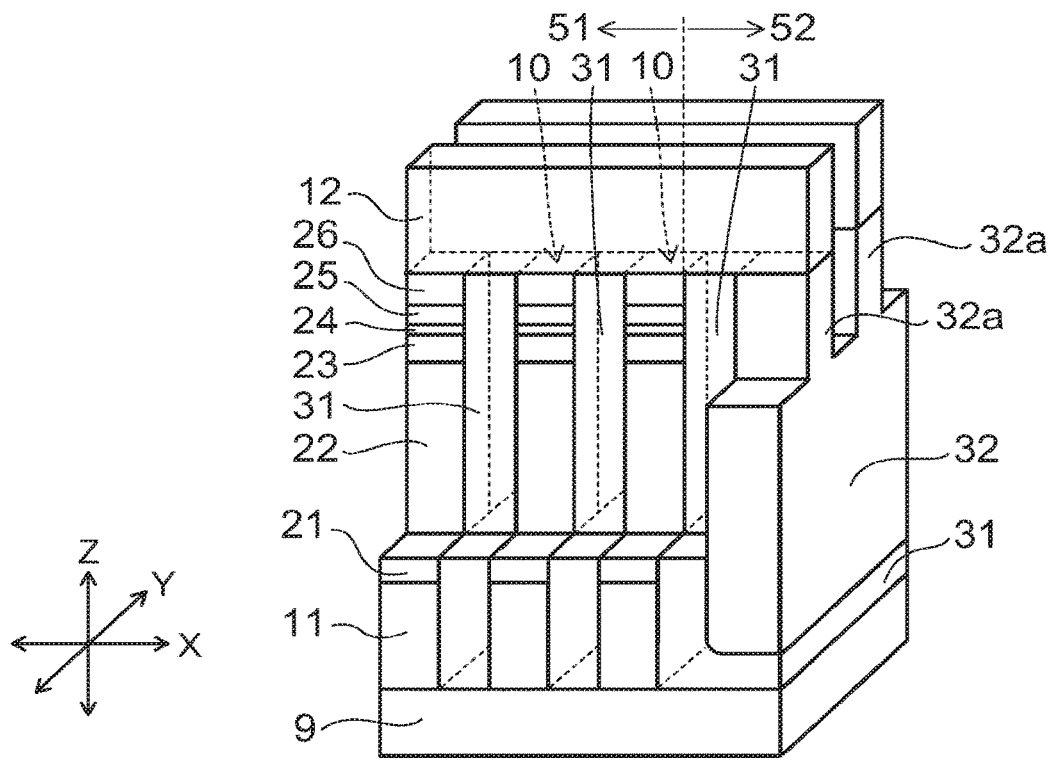

FIG. 6B shows an example of the configuration of the stacked film 10.

The stacked film 10 includes a memory element (a memory cell) and a rectifying element 22 that are connected in series between the first interconnect 11 and the second interconnect 12.

The memory element includes a variable resistance film 24. The rectifying element 22 is, for example, a silicon diode having a PIN (p-intrinsic-n) structure. The rectifying element 22 may be omitted.

The variable resistance film 24 is electrically switchable between a state (a set state) in which the resistance is relatively low and a state (a reset state) in which the resistance is relatively high to nonvolatilely store data. The rectifying element 22 prevents sneak current (sneak current) when electrically accessing (forming/programming/erasing/reading) the memory cell that is selected.

The variable resistance film 24 includes, for example, a metal oxide. For example, an oxide of one type of metal selected from the group consisting of zirconium (Zr), titanium (Ti), aluminum (Al), hafnium (Hf), manganese (Mn), tantalum (Ta), and tungsten (W) or an alloy of two or more types of the metals can be used as the metal oxide.

The variable resistance film 24 is interposed between a conductive film 25 and a conductive film 23. The conductive film 25 and the conductive film 23 are metal films or metal nitride films. For example, a titanium nitride film can be used as the conductive film 25 and the conductive film 23.

The first interconnect 11 and the second interconnect 12 are metal interconnects. Further, an electrode 26 is provided between the conductive film 25 and the second interconnect 12. The materials of the first interconnect 11, the second interconnect 12, and the electrode 26 are, for example, tungsten, titanium, tantalum, a nitride of tungsten, a nitride of titanium, a nitride of tantalum, etc.

Also, the variable resistance film 24 may be silicon; and the electrode 26 may be nickel or platinum.

A conductive film 21 is provided between the first interconnect 11 and the rectifying element 22. The conductive film 21 is a metal film or a metal nitride film. For example, a titanium nitride film can be used as the conductive film 21.

The conductive films 21, 23, and 25 prevent the diffusion of elements between the layers on and under the conductive films 21, 23, and 25. Further, the conductive films 21, 23, and 25 increase the adhesion between the layers on and under the conductive films 21, 23, and 25.

The variable resistance film 24 in the low resistance state (the set state) which has a relatively low resistance can be switched to the high resistance state (the reset state) which has a relatively high resistance when a reset voltage is applied to the variable resistance film 24 via the first interconnect 11 and the second interconnect 12.

The variable resistance film 24 can be switched to the low resistance state (the set state) when a set voltage that is higher than the reset voltage is applied to the variable resistance film 24 in the high resistance state (the reset state).

The stacked films 10 described above that include the variable resistance films 24 are patterned into columnar configurations; and an inter-layer insulating film (a first inter-layer insulating film) 31 is provided between the stacked films 10 adjacent to each other in the X direction as shown in FIG. 6B.

Figure 8A:
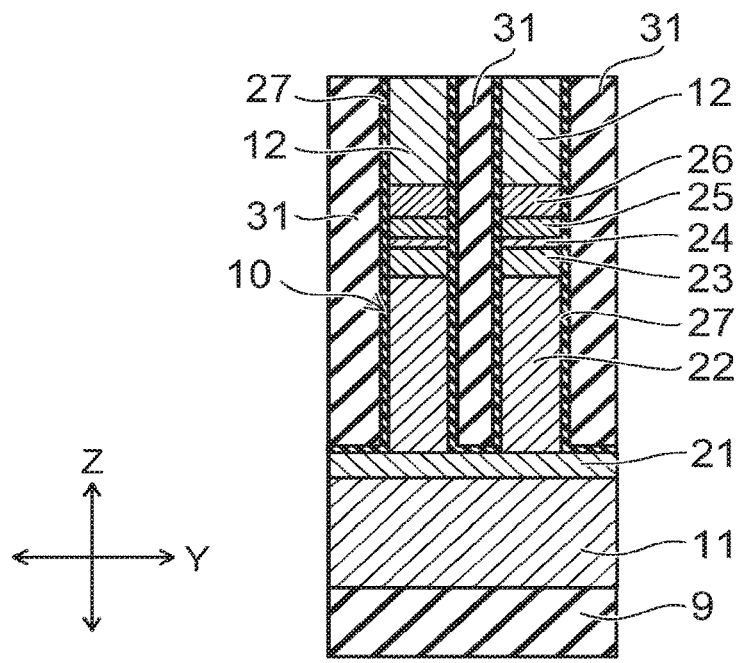
FIGS. 8A and 8B are YZ cross-sectional views showing further successive steps in the method for manufacturing a semiconductor memory device of the first embodiment.

The inter-layer insulating film 31 is provided also between the stacked films 10 adjacent to each other in the Y direction as shown in FIG. 8A.

Figure 7A:
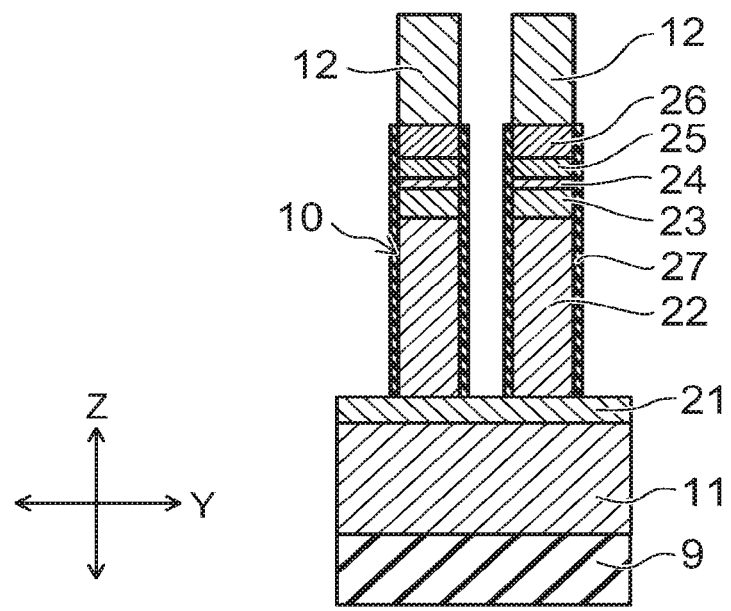
FIG. 7A is a YZ cross-sectional view of the memory cell array region of FIG. 6B
Figure 7B:
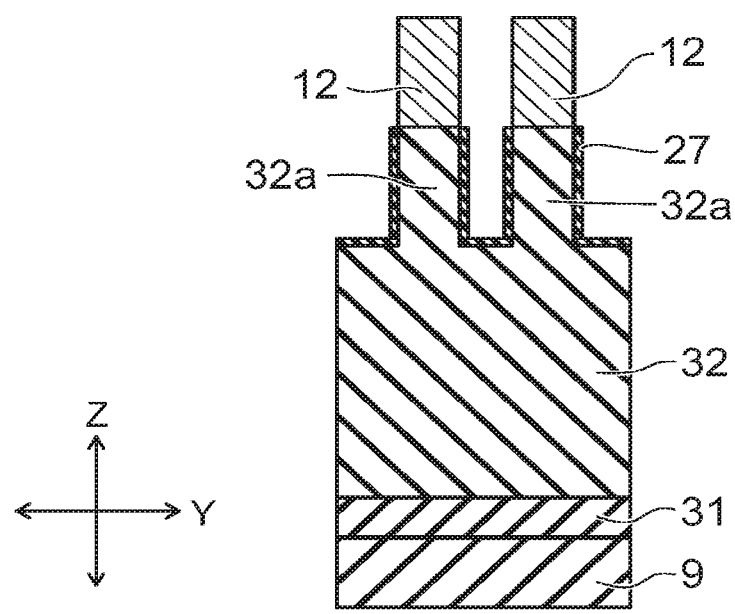
FIG. 7B is a YZ cross-sectional view of the second region 52 of FIG. 6B, respectively.

In the second region 52, an inter-layer insulating film (a second inter-layer insulating film) 32 is provided as shown in FIG. 6B and FIG. 7B.

The second interconnects 12 also extend into the second region 52; and the inter-layer insulating film 32 includes multiple protrusions 32a that support one portion of the second interconnects 12 on the second region 52. The multiple protrusions 32a are arranged in the Y direction at the same pitch as the pitch of the multiple second interconnects 12 in the Y direction.

The protruding length of the protrusions 32a in the Z direction is less than the stacking height of the stacked films 10 in the Z direction.

First Embodiment

A method for manufacturing the semiconductor memory device of the first embodiment will now be described with reference to FIG. 2A to FIG. 10. The reader may refer to the axes of the drawings for the cross-sectional direction of each drawing in, for example, the cross-sectional views such as FIG. 3A and the like.

As shown in FIG. 2A, an insulating layer 9 is formed on a not-shown substrate. The first interconnect 11 is formed on the insulating layer 9. The stacked film 10 described above is formed on the first interconnect 11. In other words, the conductive film 21, the rectifying element 22, the conductive film 23, the variable resistance film 24, the conductive film 25, and the electrode 26 are formed in order on the first interconnect 11.

Figure 2B:
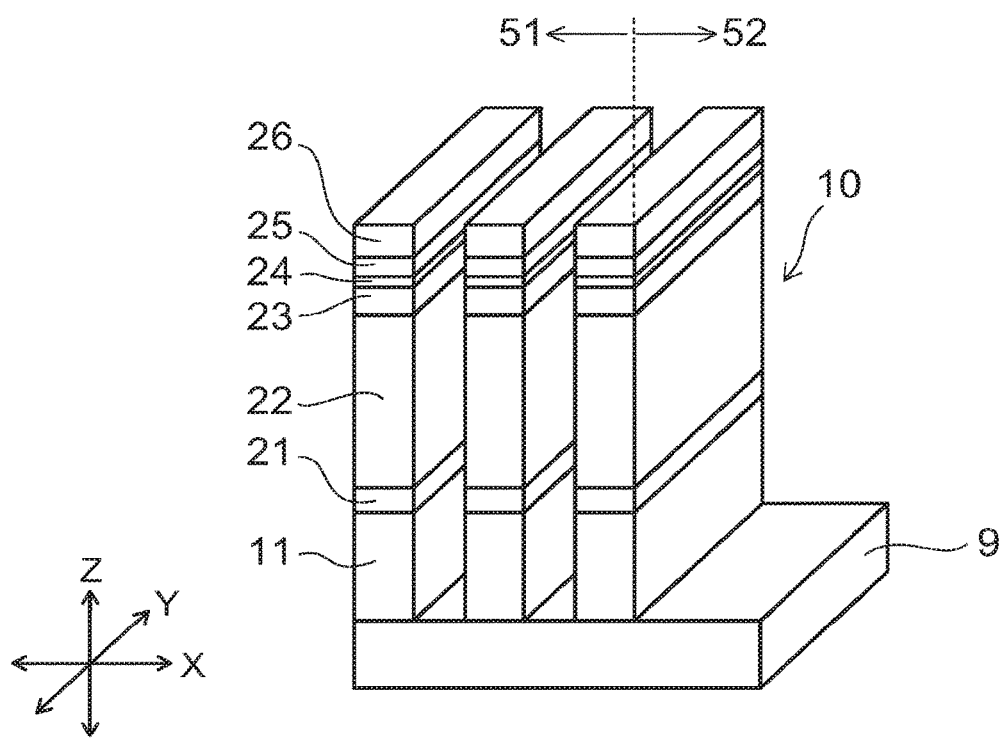

Then, the stacked film 10 and the first interconnect 11 are patterned by, for example, RIE (Reactive Ion Etching) using a not-shown mask. As shown in FIG. 2B, the stacked film 10 and the first interconnect 11 are patterned into fin configurations extending in the Y direction (the first direction).

Figure 3A:
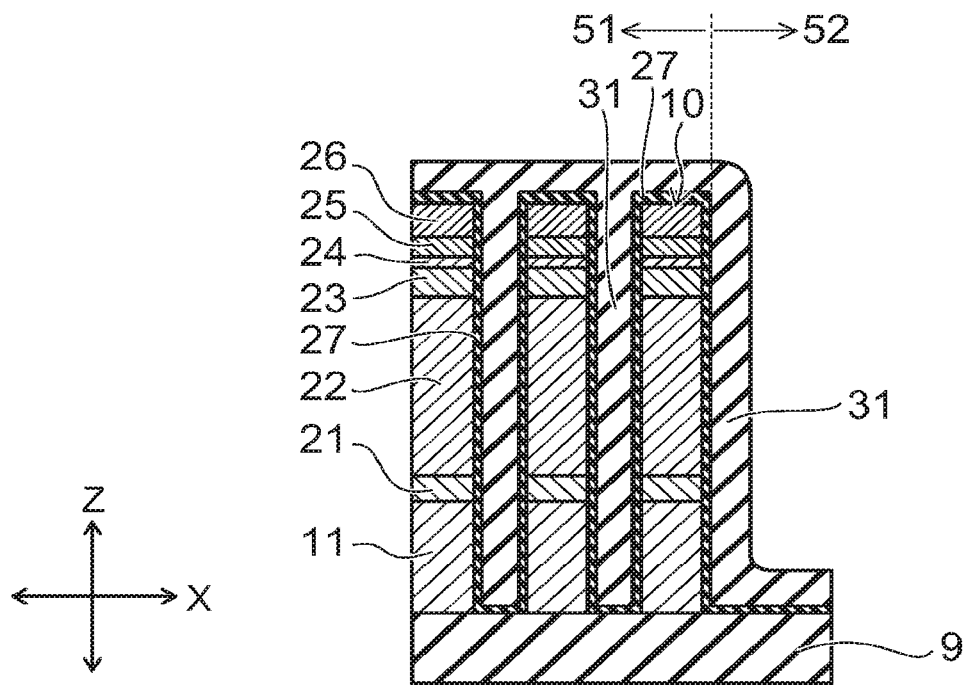
FIGS. 3A and 3B are cross-sectional views of the XZ cross section of FIGS. 4A and 4B, respectively, in the method for manufacturing a semiconductor memory device of the first embodiment.

The multiple first interconnects 11 and the multiple stacked films 10 on the first interconnects 11 are arranged in the X direction (the second direction) that is orthogonal to the Y direction with trenches interposed. Here, in FIG. 2B, the stacked films 10 have the same width in the X direction and are disposed at the same spacing in the X direction. However, the width of the outermost stacked film 10 may be wider or finer than the widths of the stacked films 10 other than the outermost stacked film 10. Also, the distance between the outermost stacked film 10 and the stacked film 10 that is one inward from the outermost stacked film 10 may be longer or shorter than the distance between the other stacked films 10. FIG. 3A corresponds to the XZ cross section of FIG. 4A.

In the perspective views, a liner film 27 is not shown for easier viewing of the drawings.

Figure 4A:
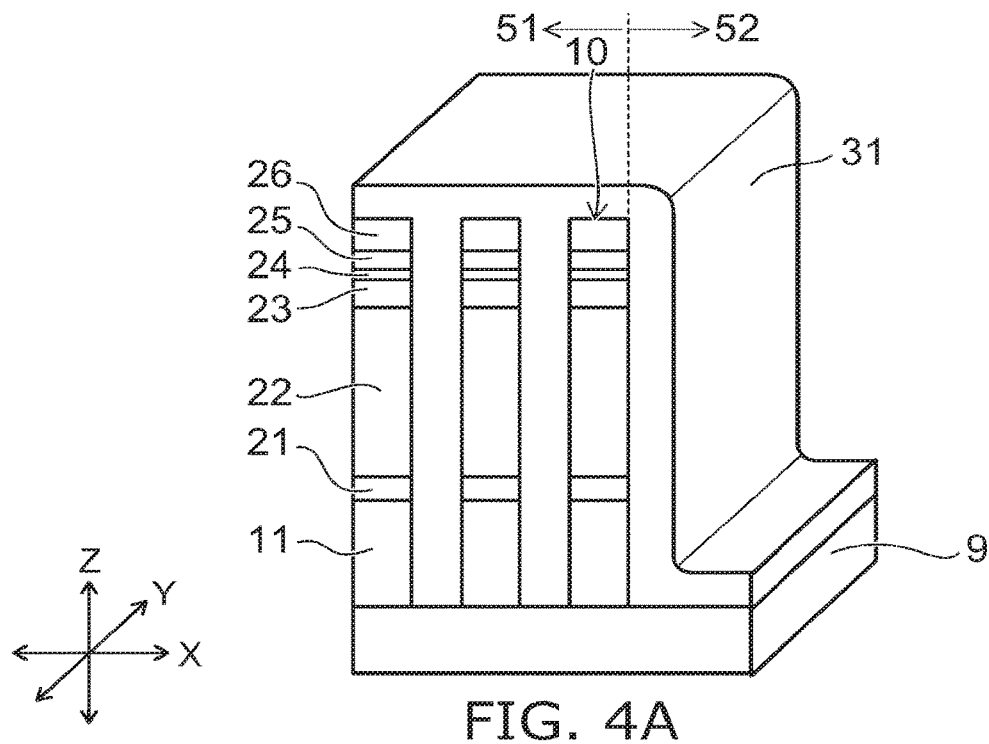
FIGS. 4A to 4B are perspective views showing successive steps in the method for manufacturing a semiconductor memory device of the first embodiment.

As shown in FIG. 3A and FIG. 4A, the inter-layer insulating film 31 is provided in a region (the first region) 51 between the first interconnects 11 that are adjacent to each other in the X direction and in the region (the first region) 51 between the stacked films 10 that are adjacent to each other in the X direction. The inter-layer insulating film 31 is filled into the first region 51 with the liner film 27 interposed.

Prior to forming the inter-layer insulating film 31, the liner film 27 is formed conformally at the upper surfaces and side surfaces of the stacked films 10, the side surfaces of the first interconnects 11, and the bottom surface of the first region 51.

A portion of the inter-layer insulating film 31 also is formed at a bottom surface of the second region 52 which has the wider width than the first region 51 and in which the stacked films 10 are not provided.

For example, a silicon oxide film or a silicon nitride film is formed as the inter-layer insulating film 31 conformally in the second region 52 while filling the first region 51 by ALD (Atomic Layer Deposition), low-pressure CVD (Chemical Vapor Deposition), flowable (flowable) CVD, etc.

Here, flowable CVD is one type of plasma CVD in which, for example, a SiOxNxHx film that is flowable similarly to a liquid is formed by mixing an impurity at a temperature of about 400° C. Subsequently, for example, $NH_3$ (gas) is released from the SiOxNxHx film to form SiO (a silicon oxide film) by baking in an $O_3$ atmosphere of about 200° C. or by water vapor gas processing at a temperature of about 350° C.

For example, the first interconnect 11 and the electrode 26 are tungsten; and the inter-layer insulating film 31 is a silicon oxide film. Also, for example, a silicon nitride film is formed as the liner film 27 at the side surface of the first interconnect 11 and at the side surface and upper surface of the electrode 26. Therefore, the tungsten is protected from oxidization, etc., by the liner film 27.

The liner film 27 may be omitted according to the material of the first interconnect 11 and/or the material of the inter-layer insulating film 31.

Figure 3B:
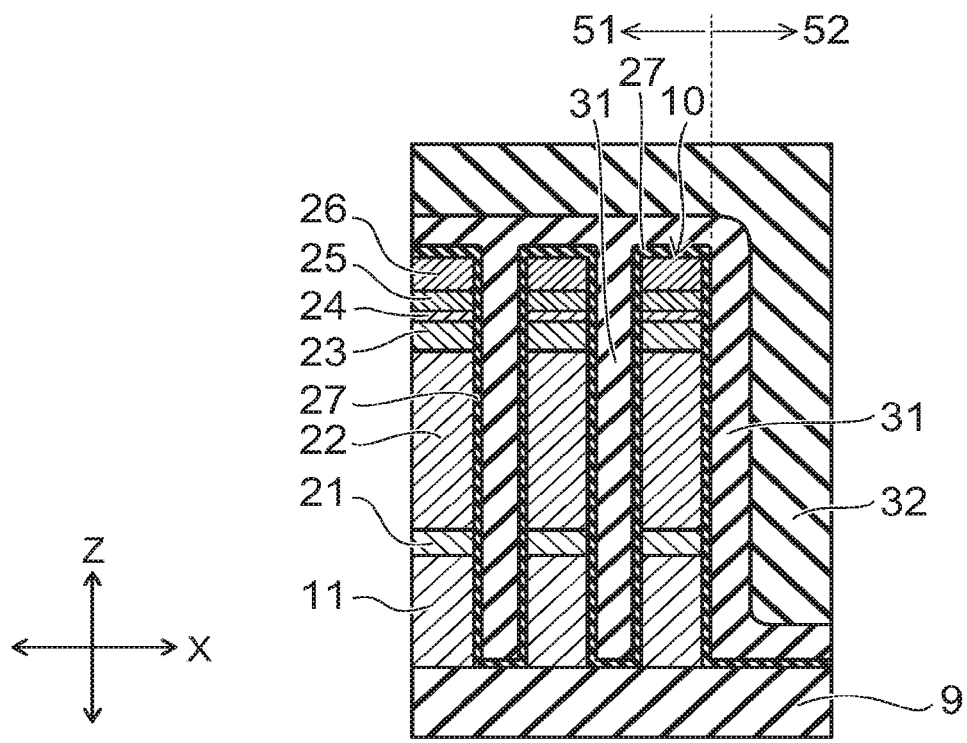
Figure 4B:
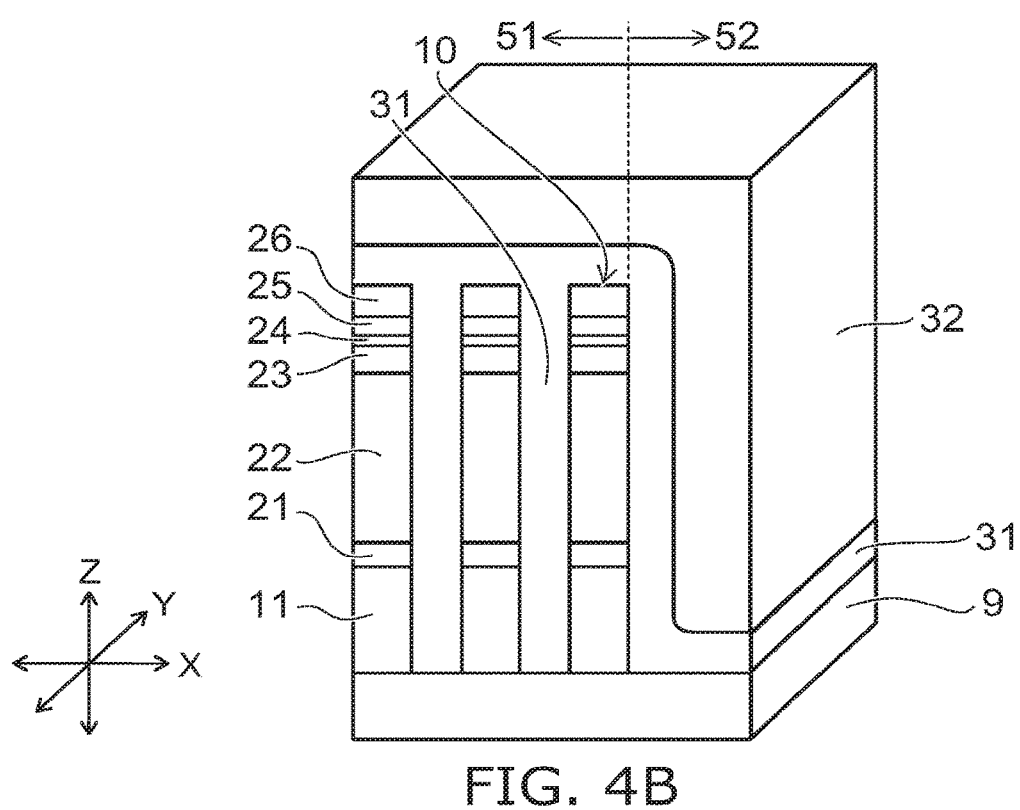

After forming the inter-layer insulating film 31, the inter-layer insulating film (the second inter-layer insulating film) 32 is formed on the inter-layer insulating film 31 in the memory cell array region and on the inter-layer insulating film 31 formed in the second region 52 as shown in FIG. 3B and FIG. 4B.

The inter-layer insulating film 32 is a silicon oxide film formed by, for example, a method such as coating, ALD, low-pressure CVD, or plasma CVD (Chemical Vapor Deposition) using a source-material gas including TEOS (Tetraethyl orthosilicate or Tetraethoxysilane).

The inter-layer insulating film 31 and the inter-layer insulating film 32 have different film properties; and the inter-layer insulating film 32 has a lower etching rate than the inter-layer insulating film 31 for etching at the same conditions described below.

The inter-layer insulating film 32 and the inter-layer insulating film 31 may include dissimilar types of films, e.g., a silicon oxide film and a silicon nitride film. Or, the inter-layer insulating film 31 and the inter-layer insulating film 32 may be, for example, films formed of silicon oxide. However, even in the case where the inter-layer insulating film 31 and the inter-layer insulating film 32 are formed of silicon oxide, the film properties are different. In other words, the inter-layer insulating film 32 is formed to be finer than the inter-layer insulating film 31; and the inter-layer insulating film 32 has a lower etching rate than the inter-layer insulating film 31 for etching at the same conditions described below.

For example, there are cases where the silicon oxide film includes hydrogen (H) due to the source-material gas. Then, it is possible to control the amount of the Si—H bonds inside the silicon oxide film by the film formation method and/or the film formation conditions. Generally, there is a tendency for the amount of the Si—H bonds to be lower as the silicon oxide film is finer. Accordingly, in the case where the silicon oxide films are used as the inter-layer insulating film 31 and the inter-layer insulating film 32, the amount of the Si—H bonds inside the inter-layer insulating film 32 is lower than the amount of the Si—H bonds inside the inter-layer insulating film 31 to cause the inter-layer insulating film 32 to be finer than the inter-layer insulating film 31. Then the etching rate of the inter-layer insulating film 32 can be caused to be lower than the etching rate of the inter-layer insulating film 31 for, for example, RIE using a gas including a fluorocarbon ($C_4F_8$, $C_4F_6$, $CF_4$, etc.).

Figure 5A:
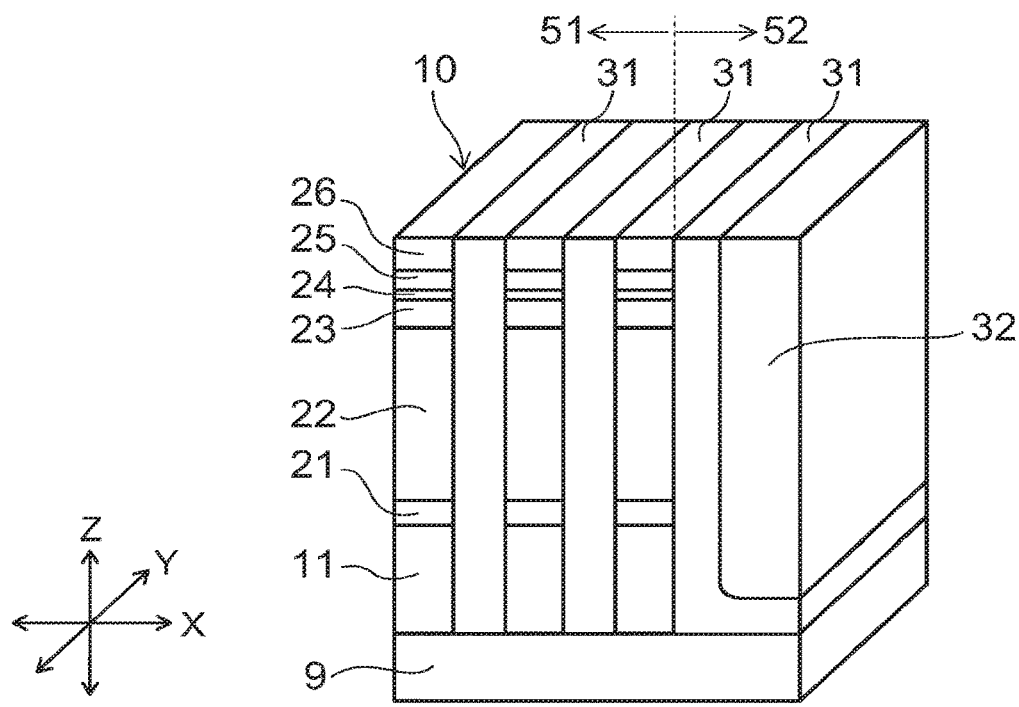
FIGS. 5A to 5B are perspective views showing further successive steps in the method for manufacturing a semiconductor memory device of the first embodiment.

After forming the inter-layer insulating film 32, the inter-layer insulating film 32 and the inter-layer insulating film 31 that are deposited on the stacked films 10 are polished and removed by, for example, CMP (Chemical Mechanical Polishing); and the upper surface of the inter-layer insulating film 31 and the upper surface of the inter-layer insulating film 32 on the second region 52 are planarized. Further, the liner film 27 formed at the upper surfaces of the stacked films 10 is removed; and the upper surfaces of the electrodes 26 of the stacked films 10 are exposed as shown in FIG. 5A.

Figure 5B:
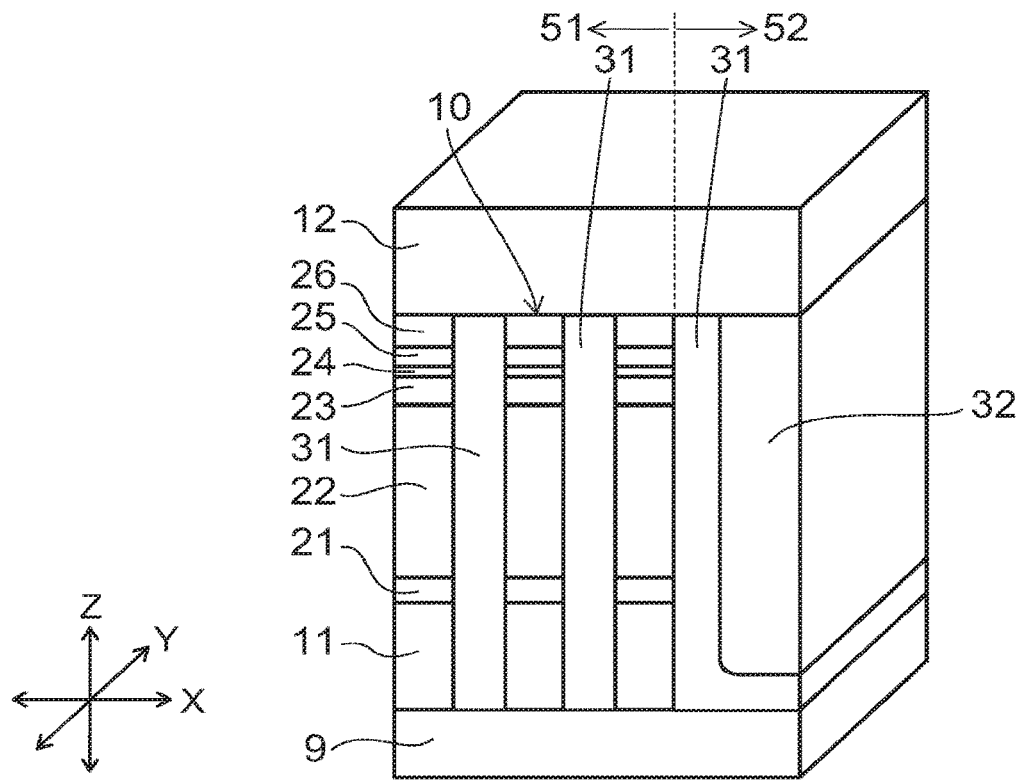

As shown in FIG. 5B, the second interconnect 12 is formed on the stacked films 10, on the inter-layer insulating film 31, and on the inter-layer insulating film 32.

The second interconnect 12 is patterned into multiple line configurations extending in the X direction as shown in FIG. 6A. The multiple second interconnects 12 are arranged in the Y direction with gaps between the second interconnects 12; and the upper surfaces of the stacked films 10 (the upper surfaces of the electrodes 26), the upper surface of the inter-layer insulating film 31, and the upper surface of the inter-layer insulating film 32 are exposed between the second interconnects 12 that are adjacent to each other in the Y direction.

The second interconnects 12 extend in the X direction through the memory cell array region where the stacked films 10 are provided and extend into the second region 52 of the periphery of the memory cell array region.

Then, the stacked films 10 and the inter-layer insulating film 31 under the spaces between the second interconnects 12 are etched by RIE using a not-shown mask.

For example, the stacked films 10 and the inter-layer insulating film 31 under the spaces between the second interconnects 12 are simultaneously etched and removed by RIE using a gas including a fluorocarbon ($C_4F_8$, $C_4F_6$, $CF_4$, etc.).

As shown in FIG. 6B, the stacked films 10 are patterned into columnar configurations by removing the portions of the stacked films 10 formed to extend in the Y direction under the spaces between the second interconnects 12 by etching. Then the stacked films 10 are left in the columnar configurations directly under the second interconnects 12.

Here, in FIG. 6B, the stacked films 10 have the same width in the Y direction and are disposed at the same spacing in the Y direction. However, the width of the outermost stacked film 10 may be wider or finer than the widths of the stacked films 10 other than the width of the outermost stacked film 10. Further, the distance between the outermost stacked film 10 and the stacked film 10 that is one inward from the outermost stacked film 10 may be longer or shorter than the distance between the other stacked films 10.

FIG. 7A shows the YZ cross section of the memory cell array region of FIG. 6B; and FIG. 7B shows the YZ cross section of the second region 52 of FIG. 6B.

When patterning the stacked films 10 into the columnar configurations, the inter-layer insulating film 31 that is provided in the first region 51 and is not covered with the second interconnects 12 between the stacked films 10 that are adjacent to each other in the X direction also is etched simultaneously.

A comparative example in which the same inter-layer insulating film 31 is provided in the first region 51 between the stacked films 10 and in the second region 52 of the periphery will now be described.

Figure 22:
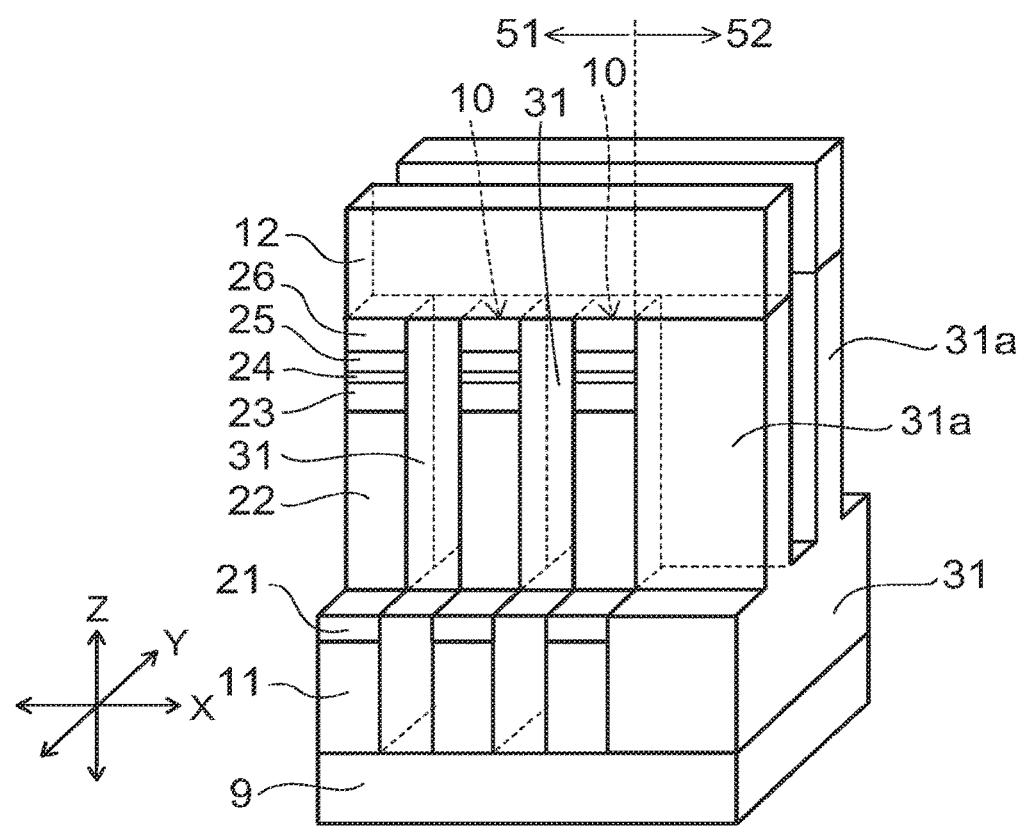
FIG. 22 is an example of a schematic perspective view showing a method for manufacturing a semiconductor memory device of a comparative example.

In the etching of the stacked films 10 in the comparative example as shown in FIG. 22, the etching of the inter-layer insulating film 31 of the second region 52 progresses substantially the same as the etching amount of the inter-layer insulating film 31 of the first region 51; and protrusions 31a of the inter-layer insulating film 31 having substantially the same height as the stacking height of the stacked films 10 are formed in the second region 52. In other words, for the protrusions 31a of the inter-layer insulating film 31 of the peripheral region, the height easily becomes greater than the width (the Y-direction width).

The silicon oxide film that is generally used often as the inter-layer insulating film 31 has a smaller Young's modulus than the tungsten, the metal compound, or the like included in the stacked films 10. Accordingly, the one portion of the second interconnects 12 that extends into the second region 52 is supported by the protrusions 31a of the inter-layer insulating film 31 which have a large height with respect to the width (the Y-direction width) and have a smaller Young's modulus (are softer) than the stacked films 10; and there may be problems in which the second interconnects 12 collapse in the peripheral region.

Conversely, according to the embodiment, the inter-layer insulating film 32, which has a lower etching rate than the inter-layer insulating film 31 that is formed between the stacked films 10, is formed in the second region 52.

Accordingly, the inter-layer insulating film 32 under the spaces between the second interconnects 12 of the second region 52 is etched at an etching rate that is lower than the etching rate of the inter-layer insulating film 31 in the etching of the stacked films 10 and the inter-layer insulating film 31 when patterning the stacked films 10 into the columnar configurations.

Accordingly, the etching amount of the inter-layer insulating film 32 in the second region 52 is suppressed to be less than the etching amount of the inter-layer insulating film 31; and the bottom surface of the portion of the inter-layer insulating film 32 removed by the etching is at a position that is higher than the bottom surface of the portion of the inter-layer insulating film 31 removed by the etching as shown in FIG. 6B.

In other words, the Z-direction protruding length of the protrusions 32a of the inter-layer insulating film 32 that are left under the second interconnects 12 in the second region 52 is less than the Z direction stacking height of the stacked films 10 that have the columnar configurations that are left under the second interconnects 12 in the memory cell array region.

Thus, according to the embodiment, the etching amount of the inter-layer insulating film 32 can be suppressed in the peripheral region (the second region 52) in which the stacked films 10 are not provided and the one portion of the second interconnects 12 is supported by the inter-layer insulating film 32.

Therefore, the increase of the aspect ratio (the ratio of the height to the Y-direction width) of the protrusions 32a of the inter-layer insulating film 32 that support the second interconnects 12 can be suppressed; and the second interconnects 12 can be stably supported in the second region 52. As a result, interconnect-interconnect shorts due to the collapse of the second interconnects 12 can be prevented.

Moreover, the interconnect-interconnect shorts due to the collapse of the second interconnects 12 can be prevented even in the case where the inter-layer insulating film 32 includes an insulating film (e.g., a silicon oxide film) that has a smaller Young's modulus and is softer than the film of the tungsten, the metal compound, or the like included in the stacked films 10.

As shown in FIG. 8A that shows the YZ cross section of the memory cell array region, the inter-layer insulating film 31 is provided in the portion (the trenches extending in the X direction) from which the stacked films 10 and the inter-layer insulating film 31 are removed by the etching described above.

The inter-layer insulating film 31 is filled between the stacked films 10 that are adjacent to each other in the Y direction and between the second interconnects 12 that are adjacent to each other in the Y direction with the liner film 27 interposed. The upper surface of the inter-layer insulating film 31 is planarized by, for example, CPM; and the upper surfaces of the second interconnects 12 are exposed.

Figure 8B:
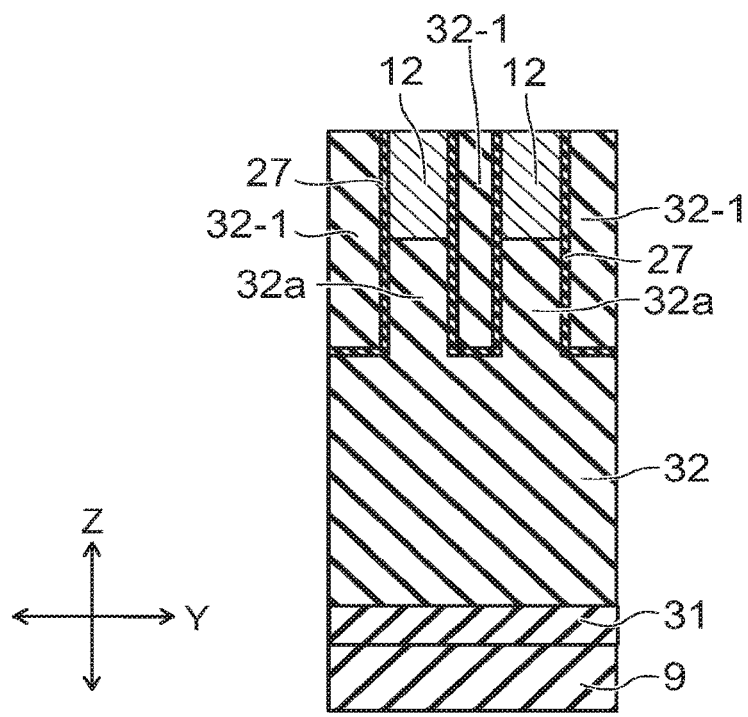

Also, as shown in FIG. 8B that shows the YZ cross section of the second region 52, the inter-layer insulating film is provided at the portion from which the inter-layer insulating film 32 of the second region 52 is removed by the etching described above.

An inter-layer insulating film 32-1 is filled between the protrusions 32a that are adjacent to each other in the Y direction and between the second interconnects 12 that are adjacent to each other in the Y direction with the liner film 27 interposed. In other words, the liner film 27 is formed to trace the protrusions 32a; and it can be said that the liner film 27 causes the configurations of the protrusions 32a to be distinct.

Further, the inter-layer insulating film 32 contacts the inter-layer insulating film 32-1 via the liner film 27 that is formed at the surfaces of the protrusions 32a. The upper surface of the inter-layer insulating film 32 is planarized by, for example, CPM. A film of the same material as that of the inter-layer insulating film 32 can be used as the inter-layer insulating film 32-1.

Figure 9:
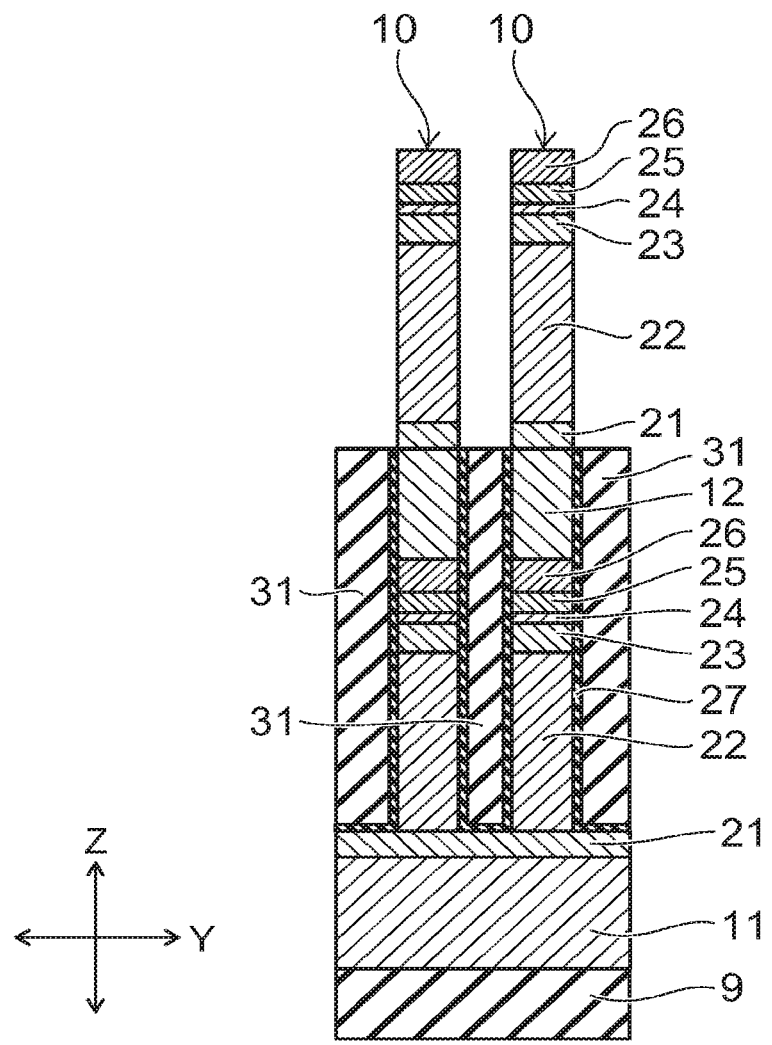
FIGS. 9 to 10 are YZ cross-sectional views showing further successive steps in the method for manufacturing a semiconductor memory device of the first embodiment.

Then, as shown in FIG. 9, the stacked film 10 that includes the conductive film 21, the rectifying element 22, the conductive film 23, the variable resistance film 24, the conductive film 25, and the electrode 26 is stacked again on the second interconnects 12 in the memory cell array region.

After the stacked film 10 is stacked over the entire surface of the upper surface of the inter-layer insulating film 31 and the upper surfaces of the second interconnects 12 that are planarized, the stacked film 10 is patterned into fin configurations extending in the X direction (the direction piercing the page surface in FIG. 9) as shown in FIG. 9 by RIE using a not-shown mask.

Figure 10:
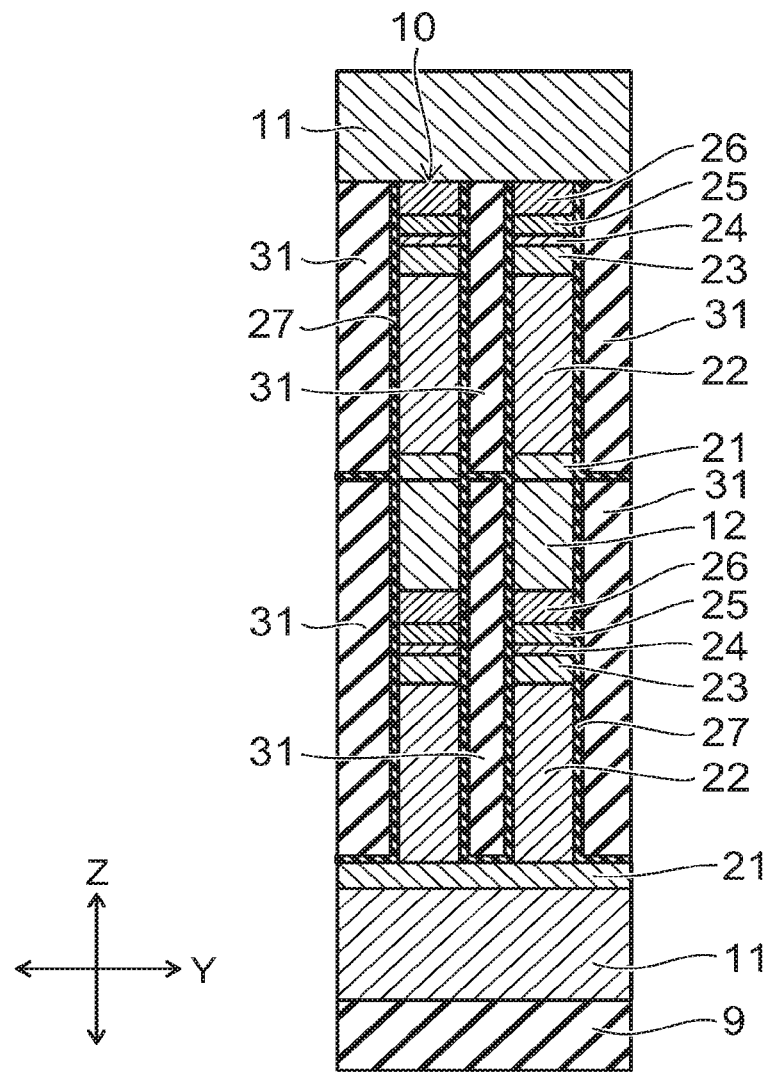

As shown in FIG. 10, the inter-layer insulating film 31 is provided between the stacked films 10 that are adjacent to each other in the Y direction with the liner film 27 interposed.

In the second region 52, the inter-layer insulating film 32 is further stacked on the second interconnects 12 and on the inter-layer insulating film 32-1 shown in FIG. 8B. The upper surface of the inter-layer insulating film 32 is planarized by CMP and is caused to be the same height as the upper surface of the inter-layer insulating film 31 and the upper surfaces of the stacked films 10 of the memory cell array region shown in FIG. 10.

Then, as shown in FIG. 10, the first interconnect 11 is formed on the stacked films 10 (on the electrodes 26) and on the inter-layer insulating film 31 in the memory cell array region and on the inter-layer insulating film 32 of the second region 52.

The first interconnect 11 is patterned into multiple line configurations extending in the Y direction; and processes similar to the processes of the stacked films 10 of the lower level side described above are repeated for the stacked films 10 of the upper level side of FIG. 10.

In other words, the stacked films 10 of the upper level side that are formed to extend in the X direction in FIG. 10 are patterned into columnar configurations by etching the stacked films 10 and the inter-layer insulating film 31 exposed between the first interconnects 11 that are mutually adjacent in the X direction (the direction piercing the page surface in FIG. 10).

At this time, the inter-layer insulating film 31 that is not under the first interconnects 11 in the memory cell array region and is exposed between the first interconnects 11 that are adjacent to each other in the X direction also is etched simultaneously.

The first interconnects 11 extend in the Y direction to cross over the stacked films 10 of the upper level side and extend into the second region 52 of the periphery of the memory cell array region.

Then, the inter-layer insulating film 32 is formed in the second region 52. Accordingly, in the etching when patterning the stacked films 10 of the upper level side into the pillar configurations, the inter-layer insulating film 32 under the spaces between the first interconnects 11 of the second region 52 is etched at an etching rate that is lower than the etching rate of the inter-layer insulating film 31.

Accordingly, the etching amount of the inter-layer insulating film 32 in the second region 52 can be suppressed to be less than the etching amount of the inter-layer insulating film 31; the increase of the aspect ratio of the protrusions of the inter-layer insulating film 32 that support one portion of the first interconnects 11 in the second region 52 can be suppressed; and the first interconnects 11 can be stably supported by the inter-layer insulating film 32 in the second region 52. As a result, the interconnect-interconnect shorts due to the collapse of the first interconnects 11 can be prevented.

Thereafter, the processes described above are repeated according to the number of stacks of the memory cell array that includes the first interconnects 11, the second interconnects 12, and the stacked films 10.

Second Embodiment

A method for manufacturing a semiconductor memory device of a second embodiment will now be described with reference to FIG. 11A to FIG. 13B.

Figure 11A:
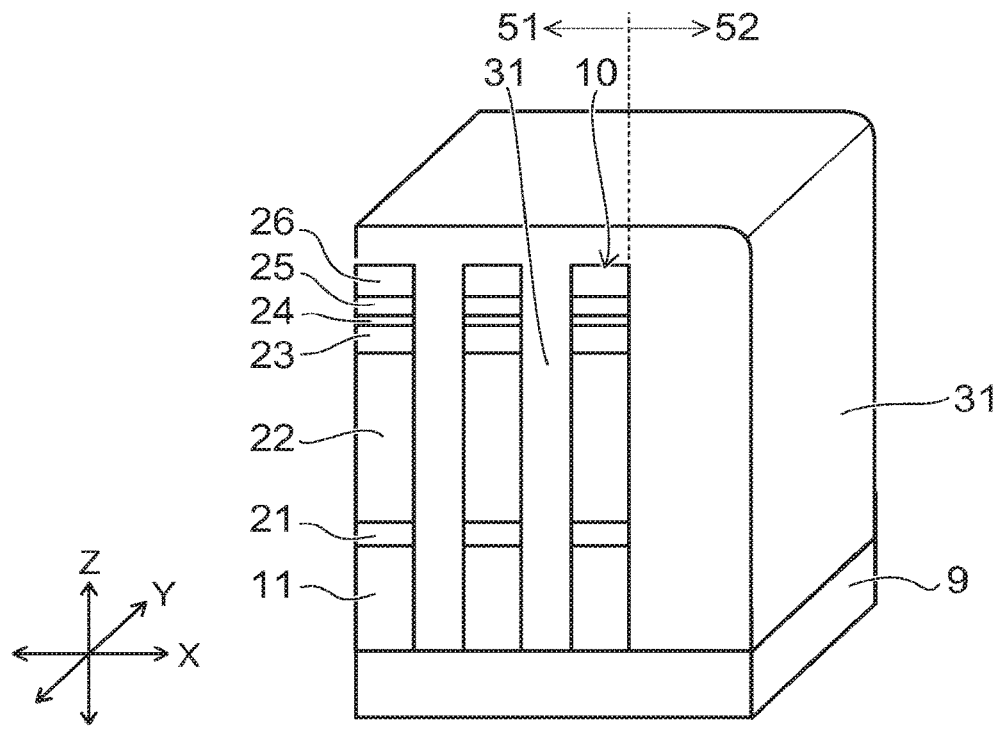
FIGS. 11A to 11B are perspective views showing an early step in a method for manufacturing a semiconductor memory device of a second embodiment.

After processes similar to those of the first embodiment described above are performed up to the process of FIG. 2B, the inter-layer insulating film 31 is provided in the region (the first region) 51 between the first interconnects 11 that are adjacent to each other in the X direction and in the region (the first region) 51 between the stacked films 10 that are adjacent to each other in the X direction as shown in FIG. 11A. The inter-layer insulating film 31 is filled into the first region 51. The inter-layer insulating film 31 also is provided in the second region 52.

For example, a silicon oxide film or a silicon nitride film is formed as the inter-layer insulating film 31 by ALD, low-pressure CVD (Chemical Vapor Deposition), flowable (flowable) CVD, etc. Or, polysilazane is formed as the inter-layer insulating film 31 by coating.

Figure 11B:
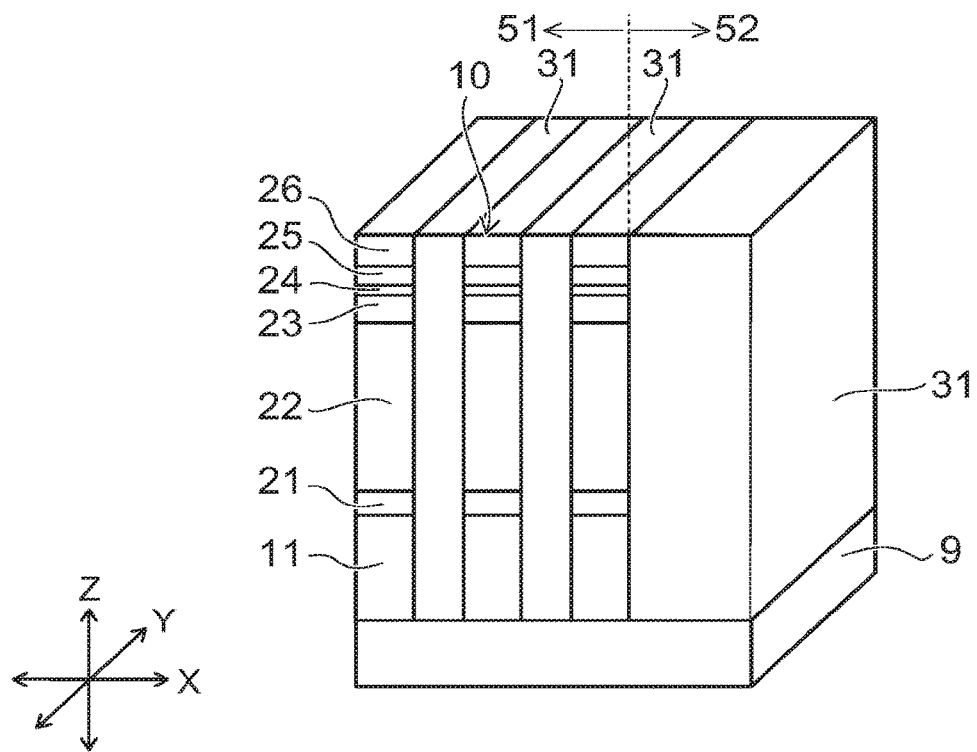

After forming the inter-layer insulating film 31, planarization is performed as shown in FIG. 11B by polishing the upper surface of the inter-layer insulating film 31 by CMP. Further, the liner film 27 of the upper surfaces of the electrodes 26 is removed to expose the electrodes 26.

Figure 12A:
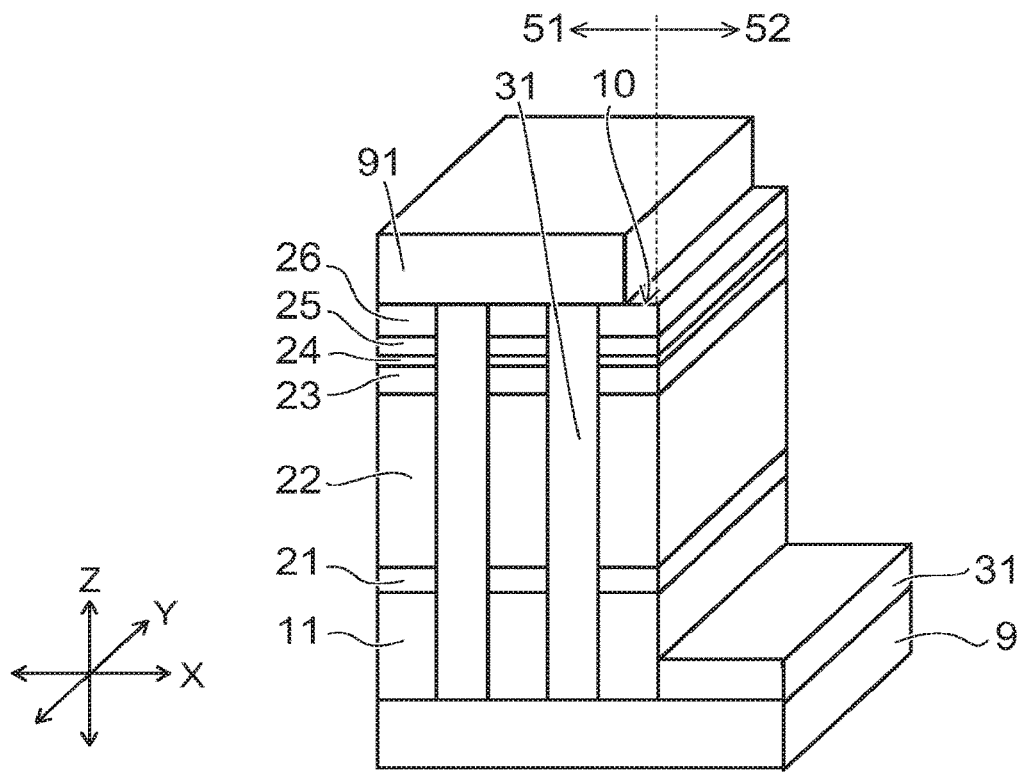
FIGS. 12A to 12B are perspective views showing successive steps in the method for manufacturing a semiconductor memory device of the second embodiment.

Then, after covering the inter-layer insulating film 31 in the memory cell array region with a mask 91 as shown in FIG. 12A, etch-back of the inter-layer insulating film 31 of the second region 52 is performed.

The mask 91 is, for example, a resist film that is patterned by lithography and developing to expose the second region 52 and to remain in the memory cell array region.

By the etch-back of the inter-layer insulating film 31, the inter-layer insulating film 31 of the second region 52 is mostly removed and is left at the bottom portion of the second region 52. Or, the entire inter-layer insulating film 31 of the second region 52 may be removed.

Figure 12B:
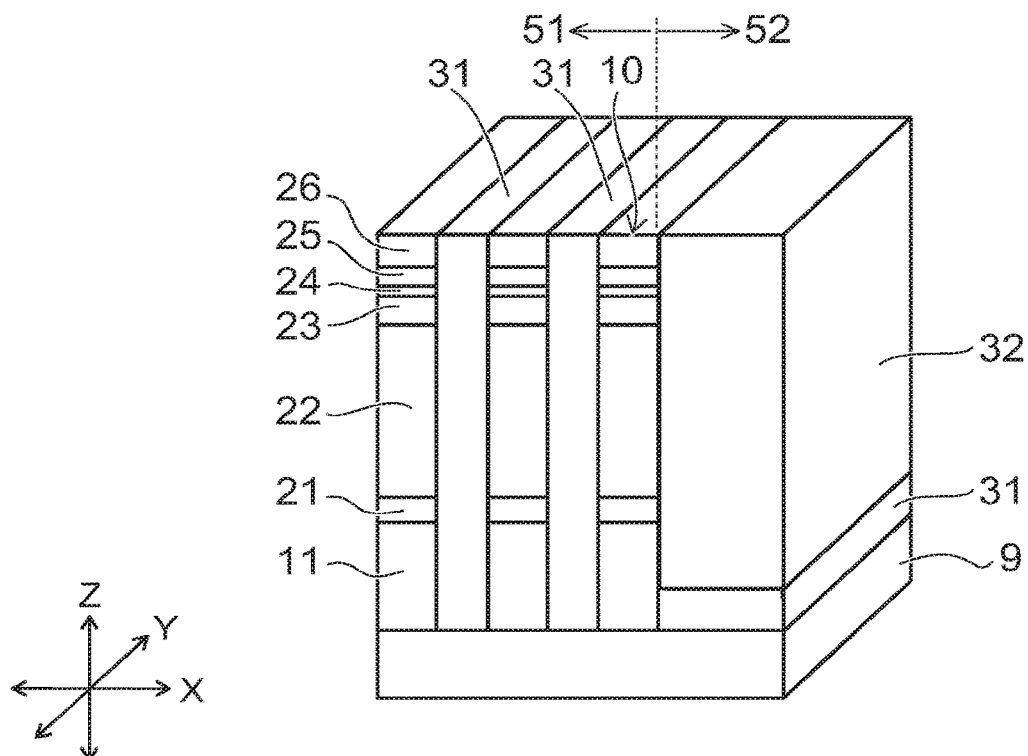

After the etch-back of the inter-layer insulating film 31 of the second region 52, the inter-layer insulating film 32 is formed at the portion removed by the etch-back as shown in FIG. 12B.

The inter-layer insulating film 32 is a silicon oxide film formed by, for example, a method such as coating, ALD, low-pressure CVD, or plasma CVD using a source-material gas including TEOS.

Similarly to the first embodiment, the inter-layer insulating film 32 has a lower etching rate than the inter-layer insulating film 31 for etching at the same conditions.

The upper surface of the inter-layer insulating film 32 is planarized by CMP after forming the inter-layer insulating film 32. The upper surfaces of the electrodes 26 of the stacked films 10 are exposed in the memory cell array region.

Figure 13A:
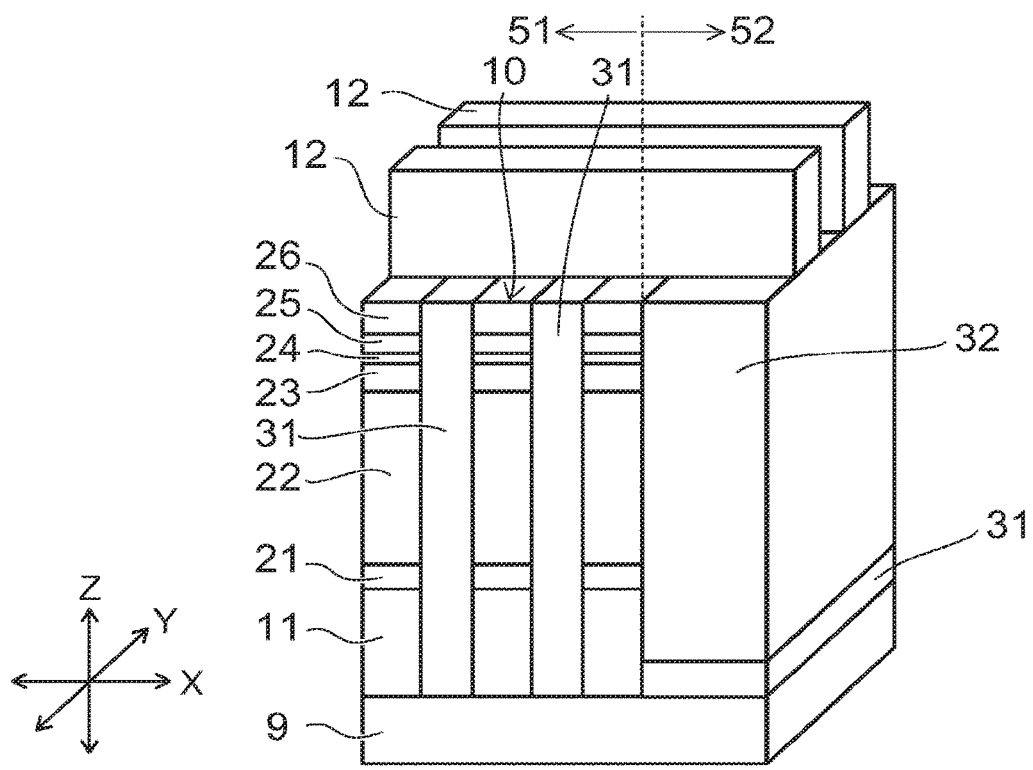
FIGS. 13A to 13B are perspective views showing successive steps in the method for manufacturing a semiconductor memory device of the second embodiment.

Then, as shown in FIG. 13A, the second interconnect 12 is formed on the stacked films 10, on the inter-layer insulating film 31, and on the inter-layer insulating film 32.

The second interconnect 12 is patterned into multiple line configurations extending in the X direction as shown in FIG. 13A. The multiple second interconnects 12 are arranged in the Y direction with gaps between the second interconnects 12; and the upper surfaces of the stacked films 10 (the upper surfaces of the electrodes 26), the upper surface of the inter-layer insulating film 31, and the upper surface of the inter-layer insulating film 32 are exposed between the second interconnects 12 that are adjacent to each other in the Y direction.

The second interconnects 12 extend in the X direction through the memory cell array region where the stacked films 10 are provided and extend into the second region 52 of the periphery of the memory cell array region.

Then, the stacked films 10 and the inter-layer insulating film 31 under the spaces between the second interconnects 12 are etched by RIE using a not-shown mask.

For example, the stacked films 10 and the inter-layer insulating film 31 under the spaces between the second interconnects 12 are simultaneously etched and removed by RIE using a gas including a fluorocarbon ($C_4F_8$, $C_4F_6$, $CF_4$, etc.).

Figure 13B:
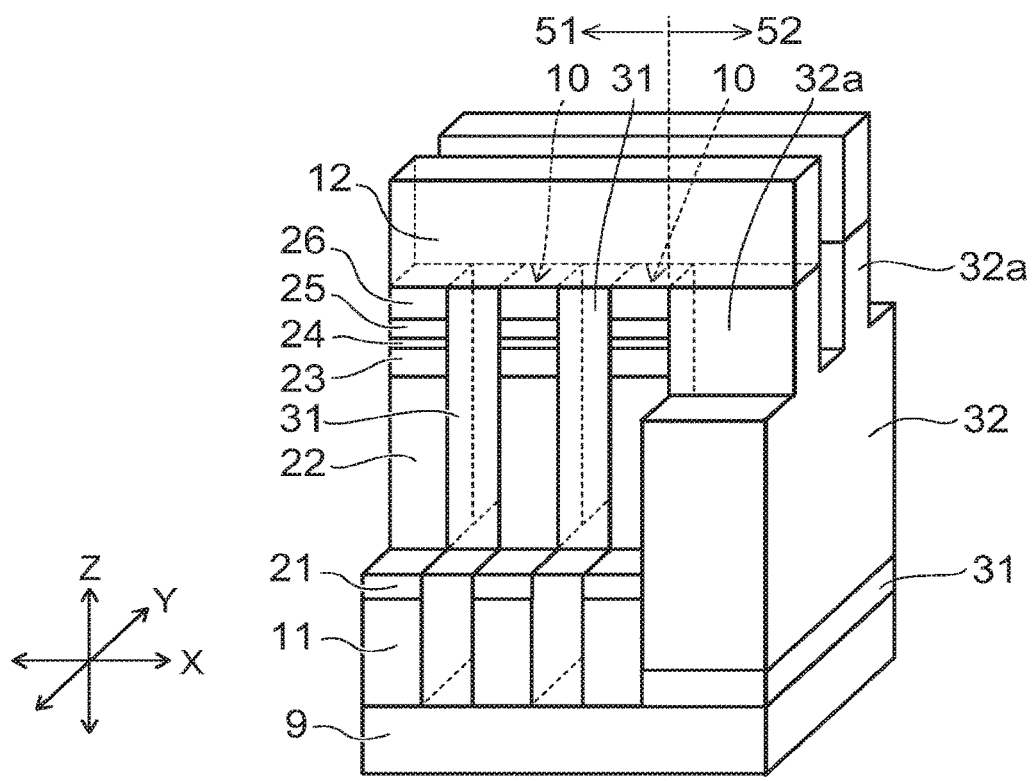

By the etching, the stacked films 10 are patterned into columnar configurations as shown in FIG. 13B. The stacked films 10 are left in the columnar configurations directly under the second interconnects 12.

When patterning the stacked films 10 into the columnar configurations, the inter-layer insulating film 31 that is provided in the first region 51 and is not covered with the second interconnects 12 between the stacked films 10 that are adjacent to each other in the X direction also is etched simultaneously.

Also, the inter-layer insulating film 32 that has a lower etching rate than the inter-layer insulating film 31 that is formed between the stacked films 10 is formed in the second region 52.

Accordingly, in the etching of the stacked films 10 and the inter-layer insulating film 31 when patterning the stacked films 10 into the columnar configurations, the inter-layer insulating film 32 under the spaces between the second interconnects 12 of the second region 52 is etched at an etching rate that is lower than the etching rate of the inter-layer insulating film 31.

Accordingly, the etching amount of the inter-layer insulating film 32 in the second region 52 is suppressed to be less than the etching amount of the inter-layer insulating film 31; and the bottom surface of the portion of the inter-layer insulating film 32 removed by the etching is at a position that is higher than the bottom surface of the portion of the inter-layer insulating film 31 removed by the etching as shown in FIG. 13B.

In other words, the Z-direction protruding length of the protrusions 32a of the inter-layer insulating film 32 that are left under the second interconnects 12 in the second region 52 is less than the Z direction stacking height of the stacked films 10 that have the columnar configurations that are left under the second interconnects 12 in the memory cell array region.

Thus, in the second embodiment as well, the etching amount of the inter-layer insulating film 32 can be suppressed in the peripheral region (the second region 52) in which the stacked films 10 are not provided and the one portion of the second interconnects 12 is supported by the inter-layer insulating film 32.

Therefore, the increase of the aspect ratio (the ratio of the height to the Y-direction width) of the protrusions 32a of the inter-layer insulating film 32 that support the second interconnects 12 can be suppressed; and the second interconnects 12 can be stably supported in the second region 52. As a result, the interconnect-interconnect shorts due to the collapse of the second interconnects 12 can be prevented.

Moreover, the interconnect-interconnect shorts due to the collapse of the second interconnects 12 can be prevented even in the case where the inter-layer insulating film 32 includes an insulating film (e.g., a silicon oxide film) that has a smaller Young's modulus and is softer than the film of the tungsten, the metal compound, or the like included in the stacked films 10.

Third Embodiment

A method for manufacturing a semiconductor memory device of a third embodiment will now be described with reference to FIG. 14A to FIG. 15B.

Figure 14A:
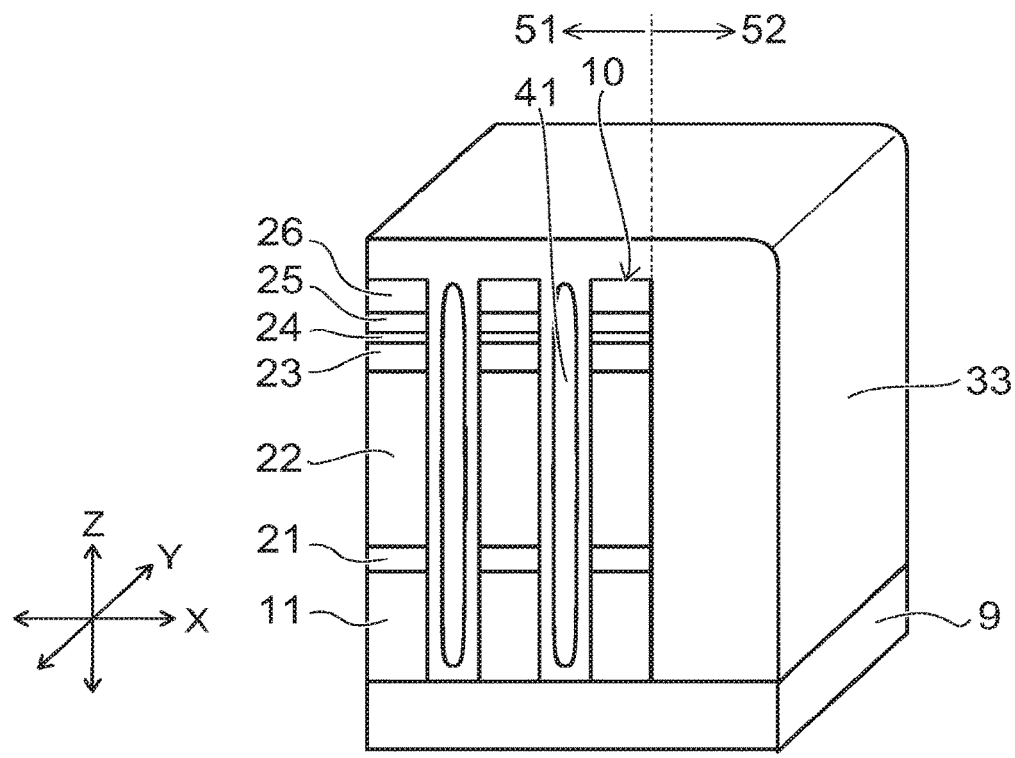
FIGS. 14A to 14B are perspective views showing early steps in a method for manufacturing a semiconductor memory device of a third embodiment.

In the third embodiment as well, processes similar to those of the first embodiment described above are performed up to the process of FIG. 2B. Subsequently, as shown in FIG. 14A, an inter-layer insulating film 33 is formed simultaneously in the first region 51 and the second region 52 while causing a gap 41 to occur inside the first region 51.

For example, polysilazane is formed as a film including silicon oxide as the inter-layer insulating film 33 by flowable CVD or coating. At this time, because a narrower width and higher aspect ratio than the second region 52 is poor, the gaps (or voids) 41 form in the first region 51 and do not form in the second region 52. The inter-layer insulating film 33 is formed to be denser than the first region 51 in the second region 52 which has a wider space than the first region 51.

Figure 14B:
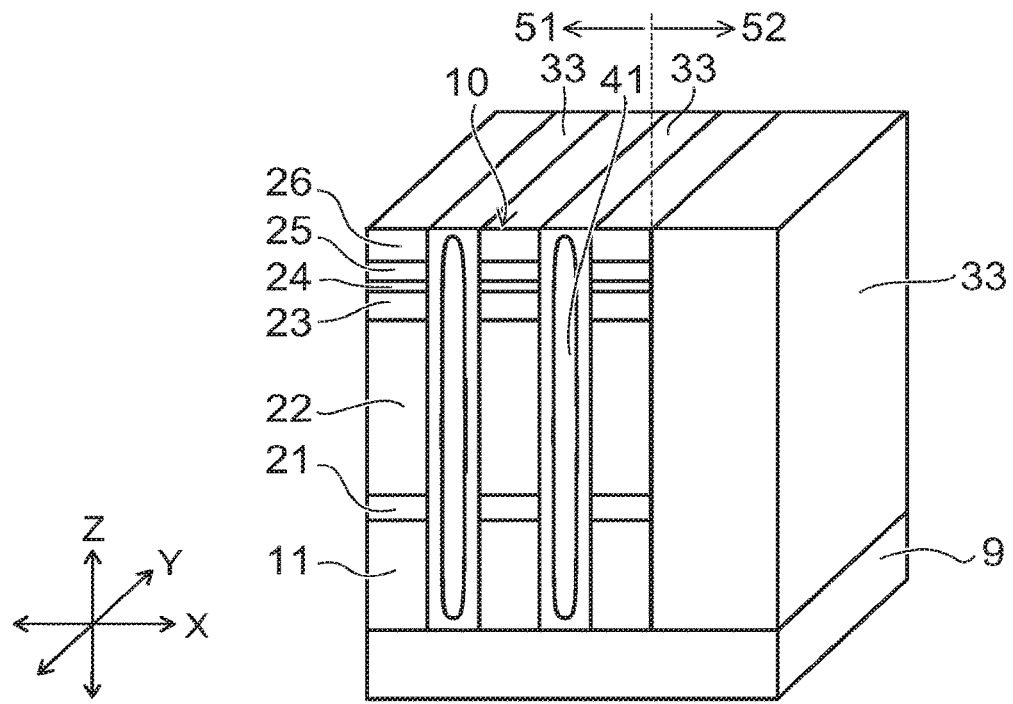

After forming the inter-layer insulating film 33, planarization is performed as shown in FIG. 14B by polishing the upper surface of the inter-layer insulating film 33 by CMP. The electrodes 26 are exposed.

Figure 15A:
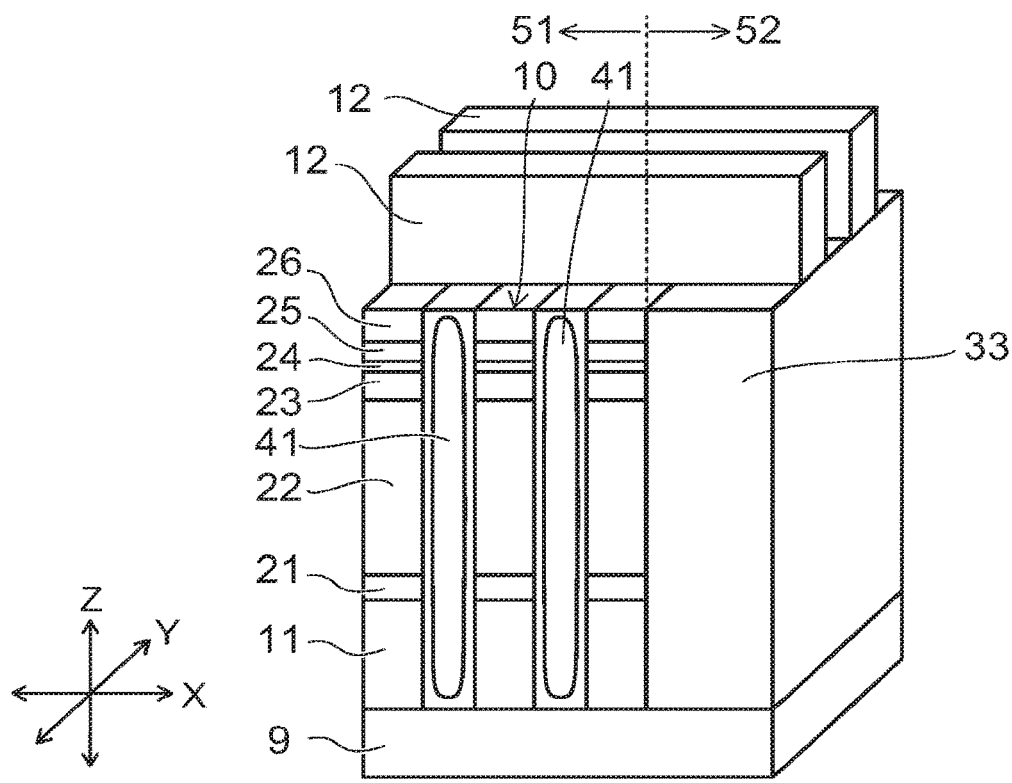
FIGS. 15A to 15B are perspective views showing successive steps in the method for manufacturing a semiconductor memory device of the third embodiment.

Then, as shown in FIG. 15A, the second interconnect 12 is formed on the stacked films 10 and on the inter-layer insulating film 33.

The second interconnect 12 is patterned into multiple line configurations extending in the X direction as shown in FIG. 15A. The multiple second interconnects 12 are arranged in the Y direction with gaps between the second interconnects 12; and the upper surfaces of the stacked films 10 (the upper surfaces of the electrodes 26) and the upper surface of the inter-layer insulating film 33 are exposed between the second interconnects 12 that are adjacent to each other in the Y direction.

The second interconnects 12 extend in the X direction through the memory cell array region where the stacked films 10 are provided and extend into the second region 52 of the periphery of the memory cell array region.

Then, the stacked films 10 and the inter-layer insulating film 33 under the spaces between the second interconnects 12 are etched by RIE using a not-shown mask.

For example, the stacked films 10 and the inter-layer insulating film 33 under the spaces between the second interconnects 12 are simultaneously etched and removed by RIE using a gas including a fluorocarbon ($C_4F_8$, $C_4F_6$, $CF_4$, etc.).

Figure 15B:
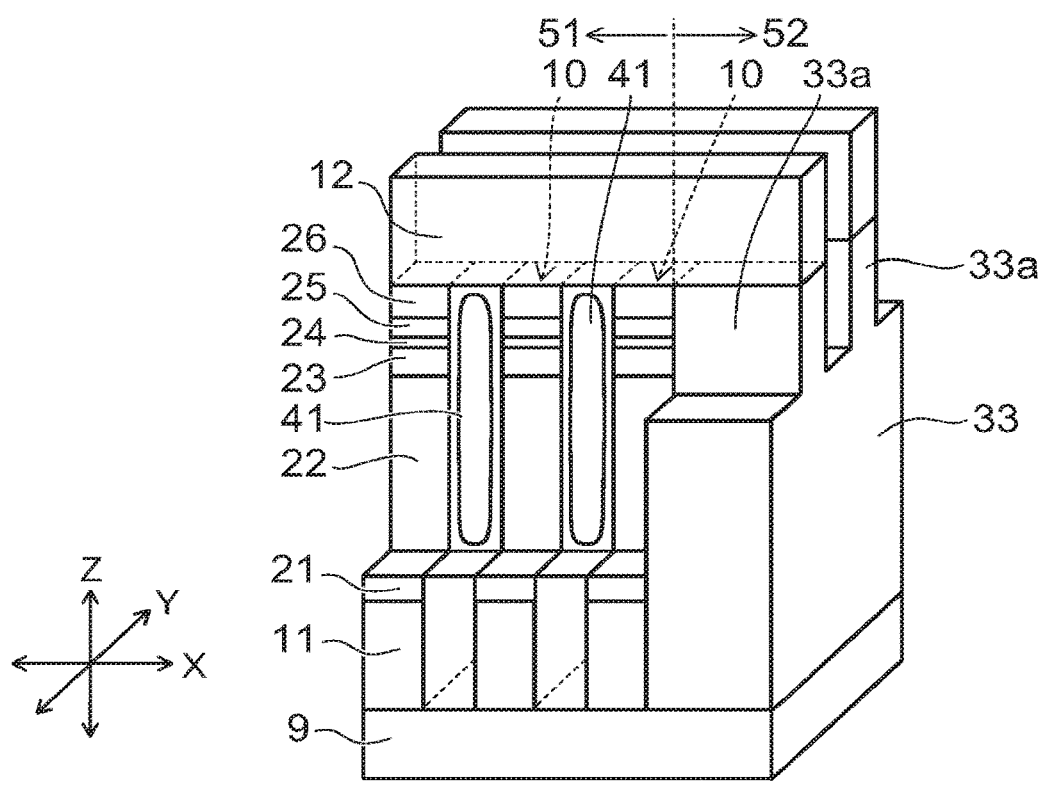

By the etching, the stacked films 10 are patterned into columnar configurations as shown in FIG. 15B. The stacked films 10 are left in the columnar configurations directly under the second interconnects 12. Also, the gaps 41 are left in the first region 51 between the mutually-adjacent stacked films 10 under the second interconnects 12.

When patterning the stacked films 10 into the columnar configurations, the inter-layer insulating film 33 that is provided in the first region 51 and is not covered with the second interconnects 12 between the stacked films 10 that are adjacent to each other in the X direction also is etched simultaneously.

At this time, the inter-layer insulating film 33 of the second region 52 also is etched. Then, according to the third embodiment, the progression of the etching is slower (the etching rate is lower) for the inter-layer insulating film 33 of the second region 52 than for the inter-layer insulating film 33 of the first region 51 because the inter-layer insulating film 33 of the second region 52 is formed to be denser than the inter-layer insulating film 33 of the first region 51.

Accordingly, the etching amount of the inter-layer insulating film 33 in the second region 52 is suppressed to be less than the etching amount of the inter-layer insulating film 33 of the first region 51; and the bottom surface of the portion of the inter-layer insulating film 33 of the second region 52 removed by the etching is at a position that is higher than the bottom surface of the portion of the inter-layer insulating film 33 of the first region 51 removed by the etching as shown in FIG. 15B.

In other words, the Z-direction protruding length of protrusions 33a of the inter-layer insulating film 33 that are left under the second interconnects 12 in the second region 52 is less than the Z direction stacking height of the stacked films 10 that have the columnar configurations that are left under the second interconnects 12 in the memory cell array region.

Thus, in the third embodiment as well, the etching amount of the inter-layer insulating film 33 of the peripheral region (the second region 52) in which the stacked films 10 are not provided and the one portion of the second interconnects 12 is supported by the inter-layer insulating film 33 can be suppressed.

Therefore, the increase of the aspect ratio (the ratio of the height to the Y-direction width) of the protrusions 33a of the inter-layer insulating film 33 that support the second interconnects 12 can be suppressed; and the second interconnects 12 can be stably supported in the second region 52. As a result, the interconnect-interconnect shorts due to the collapse of the second interconnects 12 can be prevented.

Moreover, the interconnect-interconnect shorts due to the collapse of the second interconnects 12 can be prevented even in the case where the inter-layer insulating film 33 includes an insulating film (e.g., a silicon oxide film) that has a smaller Young's modulus and is softer than the film of the tungsten, the metal compound, or the like included in the stacked films 10.

Fourth Embodiment

A method for manufacturing a semiconductor memory device of a fourth embodiment will now be described with reference to FIG. 16A to FIG. 21.

Figure 16A:
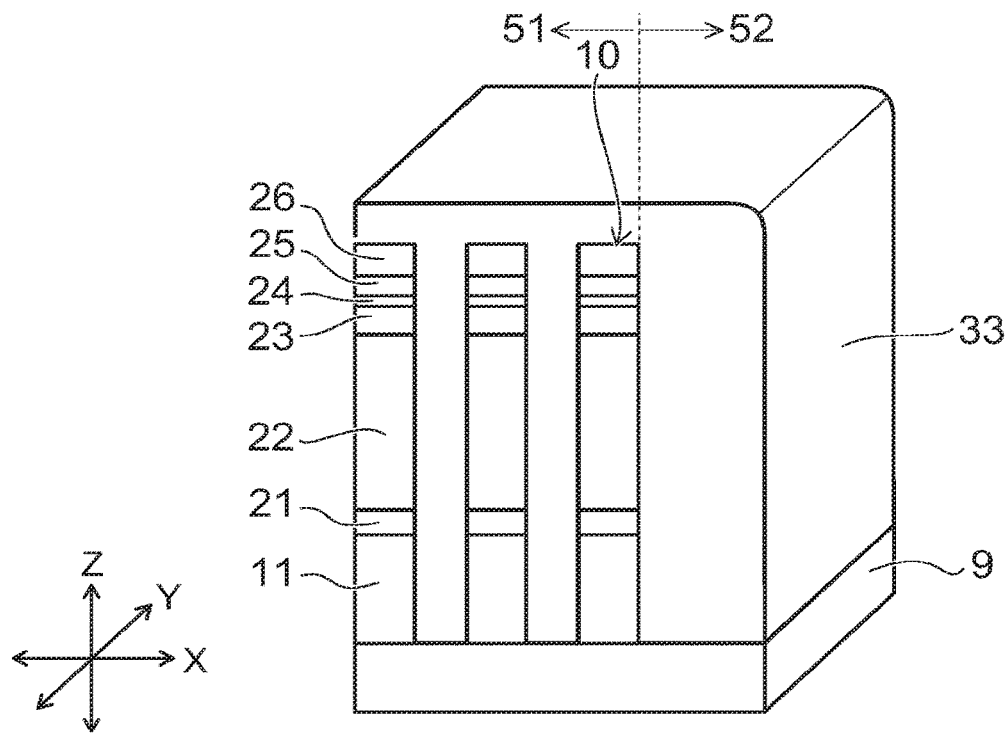
FIGS. 16A to 16B are perspective views showing an early step in a method for manufacturing a semiconductor memory device of a fourth embodiment.

In the fourth embodiment as well, after processes similar to those of the first embodiment described above are performed up to the process of FIG. 2B, the inter-layer insulating film 33 is formed simultaneously in the first region 51 and the second region 52 as shown in FIG. 16A. The inter-layer insulating film 33 is filled into the first region 51 and the second region 52.

For example, a silicon oxide film, a silicon nitride film, a polysilazane film, or the like is formed as the inter-layer insulating film 33.

Figure 16B:
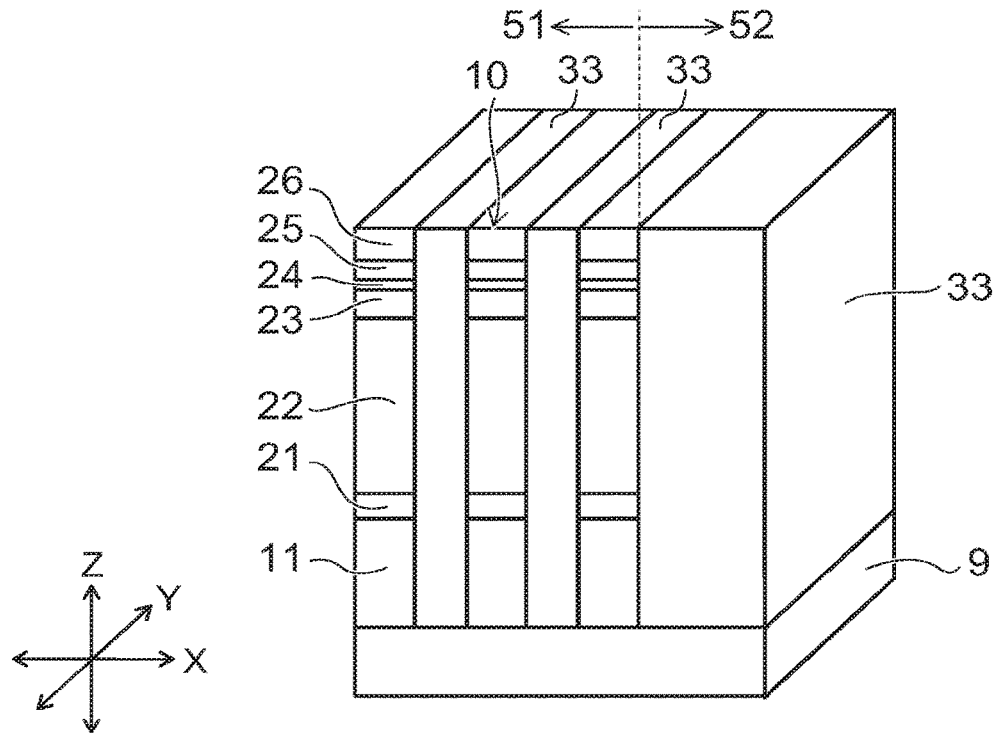

After forming the inter-layer insulating film 33, the planarization is performed as shown in FIG. 16B by polishing the upper surface of the inter-layer insulating film 33 by CMP. Further, the liner film 27 of the upper surfaces of the electrodes 26 is removed to expose the electrodes 26.

Figure 17:
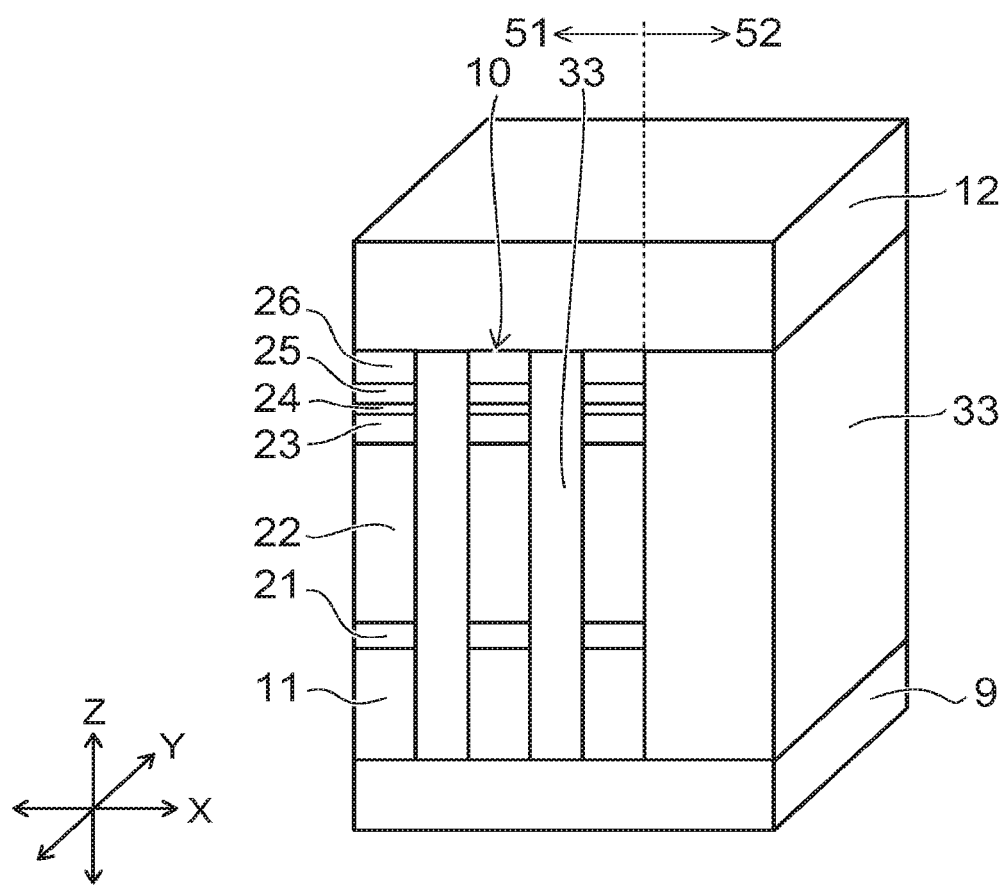
FIG. 17 is a perspective view showing a successive step in the method for manufacturing a semiconductor memory device of the fourth embodiment.

Then, as shown in FIG. 17, the second interconnect 12 is formed on the stacked films 10 and on the inter-layer insulating film 33.

Figure 18A:
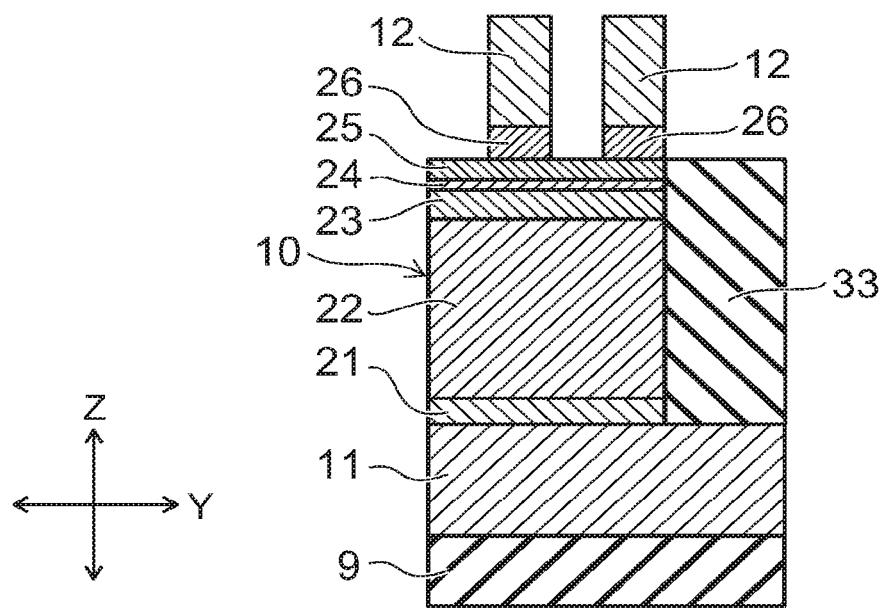
FIGS. 18A and 18B are YZ cross-sectional views showing further successive steps in the method for manufacturing a semiconductor memory device of the fourth embodiment.

The second interconnect 12 and the electrodes 26 under the second interconnect 12 are patterned into multiple line configurations extending in the X direction (the direction piercing the page surface in FIG. 18A) as shown in FIG. 18A which corresponds to the YZ cross section of FIG. 17.

Figure 18B:
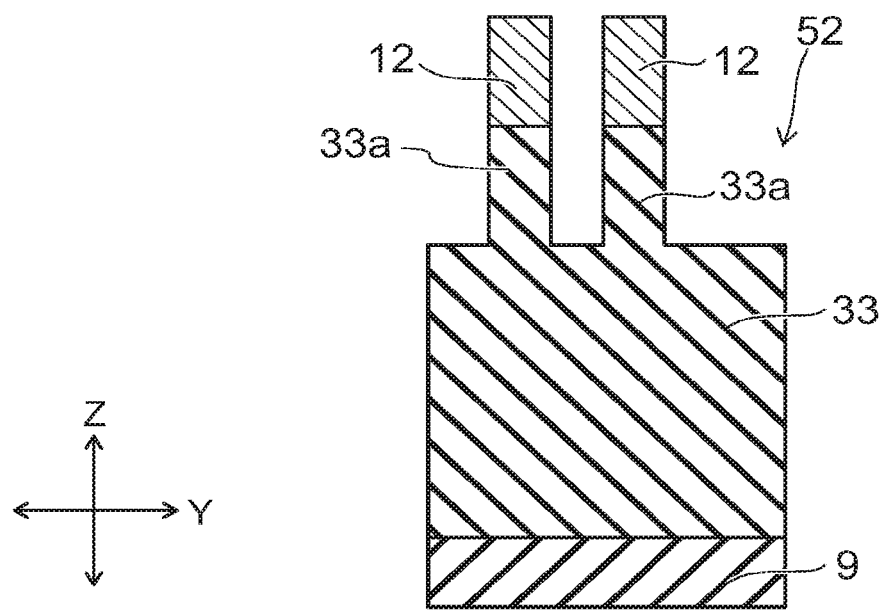

In the patterning of the second interconnects 12, the upper portion of the inter-layer insulating film 33 of the second region 52 also is patterned as shown in FIG. 18B which corresponds to the YZ cross section of the second region 52; and the protrusions 33a that extend in the X direction are formed at the upper portion of the inter-layer insulating film 33 of the second region 52.

The second interconnects 12 extend in the X direction through the memory cell array region where the stacked films 10 are provided and extend into the second region 52 of the periphery of the memory cell array region to be supported on the protrusions 33a. The aspect ratio (the ratio of the height to the Y-direction width) of the protrusions 33a is less than the Z direction height of the stacked films 10.

Figure 19:
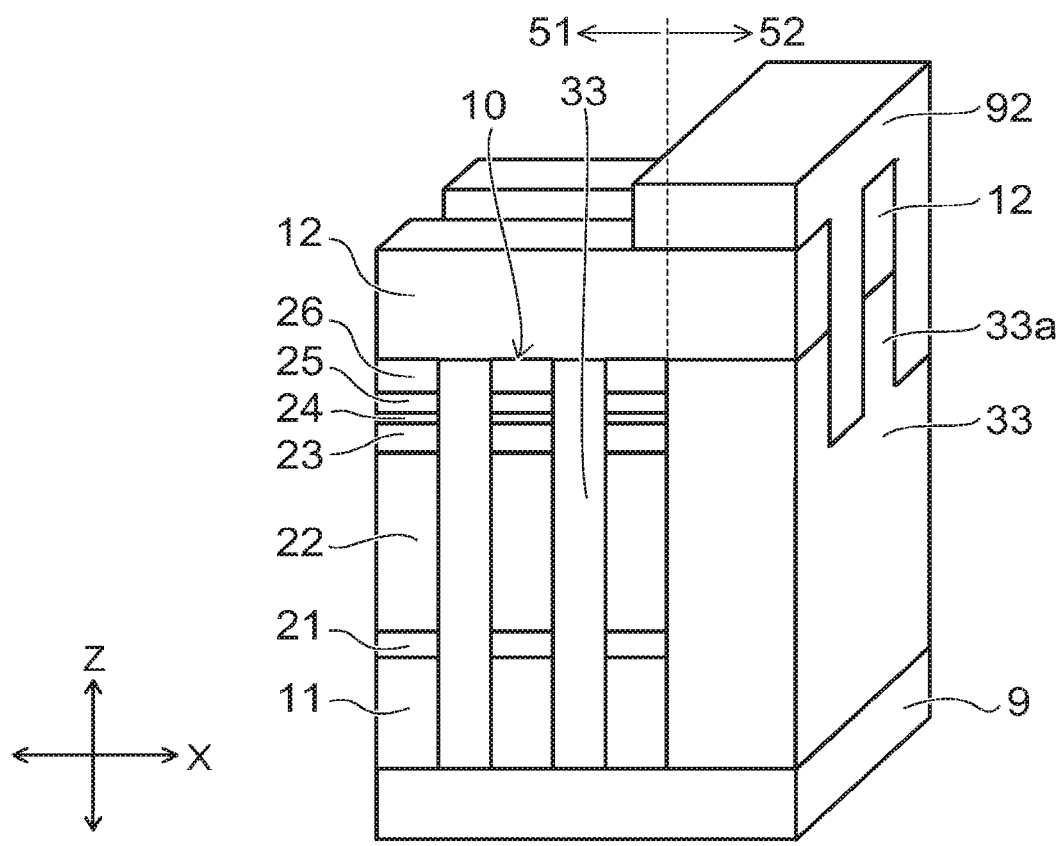
FIG. 19 is a perspective view showing a further successive step in the method for manufacturing a semiconductor memory device of the fourth embodiment.
Figure 20A:
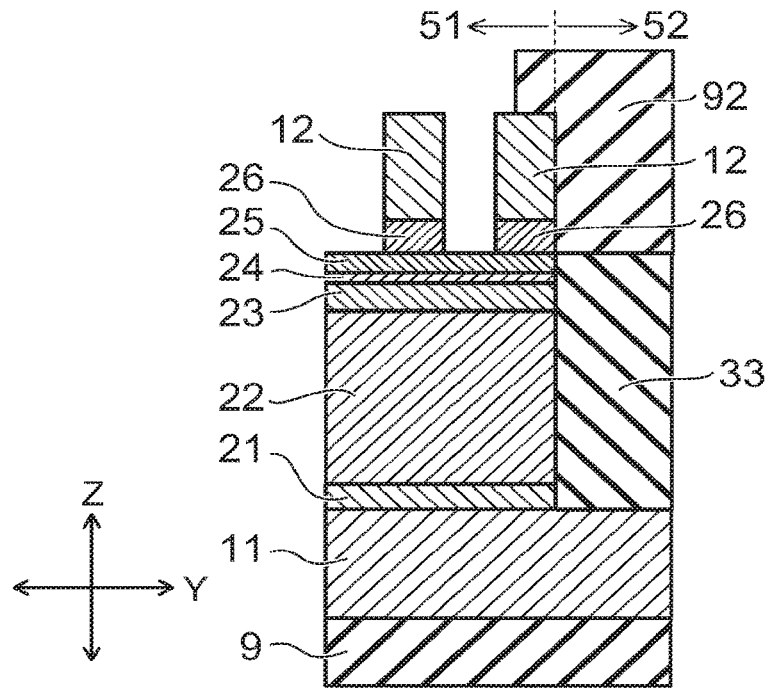
FIGS. 20A and 20B are YZ cross-sectional views showing further successive steps in the method for manufacturing a semiconductor memory device of the fourth embodiment.
Figure 20B:
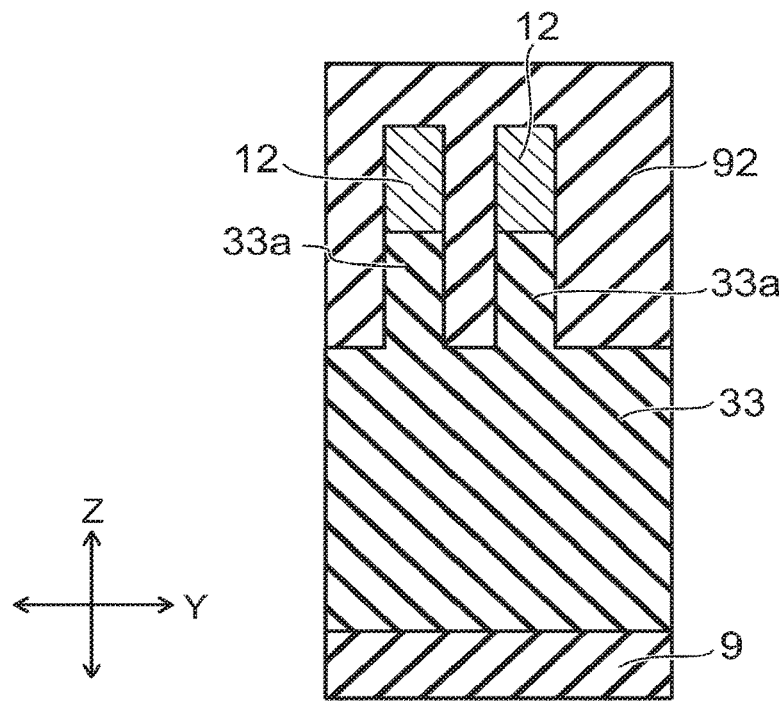

After finishing the patterning of the electrodes 26, a mask 92 is formed on the second interconnects 12 and the inter-layer insulating film 33 of the second region 52 as shown in FIG. 19, FIG. 20A, and FIG. 20B. The mask 92 is, for example, a resist film and is patterned by photolithography and developing to expose the memory cell array region and to remain in the second region 52.

Figure 21:
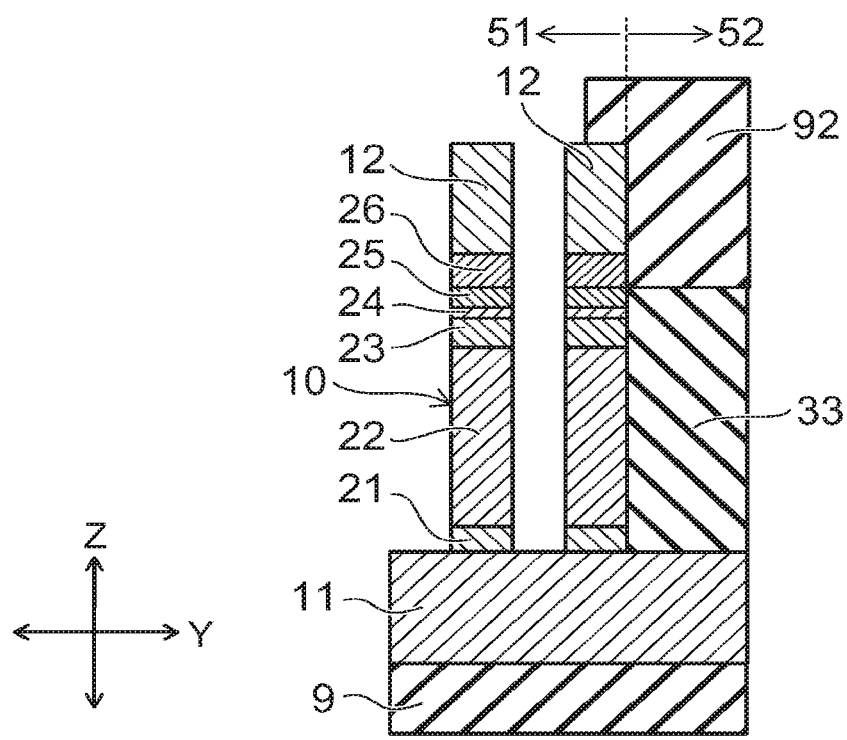
FIG. 21 is YZ cross-sectional view showing further successive step in the method for manufacturing a semiconductor memory device of the fourth embodiment.

Then, the stacked films 10 are patterned into columnar configurations as shown in FIG. 21 by etching the stacked films 10 (the conductive film 25 to the conductive film 21) under the spaces between the second interconnects 12 that are adjacent to each other in the Y direction in the state in which the second region 52 is covered and protected with the mask 92. As a result, the metal of the interconnects 12 and the electrodes 26 can be prevented from scattering and mixing into the variable resistance film 24 because the patterning of the variable resistance film 24 and the metal can be performed separately.

At this time, the inter-layer insulating film 33 that is provided in the first region 51 and is not covered with the second interconnects 12 between the stacked films 10 that are adjacent to each other in the X direction also is etched simultaneously.

At this time, the inter-layer insulating film 33 of the second region 52 is not etched from the state shown in FIG. 17 because the inter-layer insulating film 33 of the second region 52 is covered with the mask 92.

Accordingly, according to the third embodiment, the etching of the inter-layer insulating film 33 of the peripheral region (the second region 52) in which the stacked films 10 are not provided and the one portion of the second interconnects 12 is supported by the inter-layer insulating film 33 can be prevented.

Therefore, the increase of the aspect ratio (the ratio of the height to the Y-direction width) of the protrusions 33a of the inter-layer insulating film 33 that support the second interconnects 12 in the second region 52 can be suppressed; and the second interconnects 12 can be stably supported in the second region 52. As a result, the interconnect-interconnect shorts due to the collapse of the second interconnects 12 can be prevented.

Moreover, the interconnect-interconnect shorts due to the collapse of the second interconnects 12 can be prevented even in the case where the inter-layer insulating film 33 includes an insulating film (e.g., a silicon oxide film) that has a smaller Young's modulus and is softer than the film of the tungsten, the metal compound, or the like included in the stacked films 10.

The inter-layer insulating films 31, 32, and 33 described above may include, for example, a silicon oxide film formed by ALD, a silicon nitride film formed by ALD, a polysilazane film formed by coating, a silicon oxide film formed by coating, a silicon oxide film formed by low-pressure CVD using TEOS as a source material, a silicon nitride film formed by low-pressure CVD, a silicon nitride film formed by plasma CVD, a silicon oxide film formed by plasma CVD using SiH$_4$ as a source material, a silicon oxide film formed by plasma CVD using TEOS as a source material, a silicon oxide film formed by high density plasma CVD, a silicon oxide film formed by flowable CVD, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
    a plurality of first interconnects extending in a first direction, the first interconnects arranged in a second direction crossing to the first direction;
    a plurality of second interconnects extending in the second direction, the second interconnects arranged in the first direction;
    a first layer being provided on at least one of the first interconnects, the first layer including metal material, the first layer extending in the first direction;
    a plurality of stacked films respectively provided between the first interconnects and the second interconnects in a third direction crossing to the first direction and the second direction, the plurality of stacked films respectively including a variable resistance film, the stacked films arranged in the first direction and the second direction;
    a first insulating film being provided between one of the stacked films and another one of the stacked films in the first direction, the first insulating film extending at least in the third direction, the one of the stacked films and the another one of the stacked films being provided next to each other in the first direction; and
    a second insulating film in a cross sectional view perpendicular to the first direction, the second insulating film being provided between the one of the stacked films and the first insulating film in the first direction, between the first layer and the first insulating film in the third direction, and between the another one of the stacked films and the first insulating film in the first direction.

2. The device according to claim 1, wherein the second insulating film is provided between one of the second interconnects above the one of the stacked films and another one of the second interconnects above the another one of the stacked films in the first direction.

3. The device according to claim 1, wherein the stacked films respectively include an electrode provided between the second interconnect and the variable resistance film.

4. The device according to claim 1, wherein the stacked films respectively include:
    a second layer including nitride, the second layer being provided on the variable resistance film; and
    a third layer including nitride, the third layer being provided on the variable resistance film provided between the second layer and the third layer.

5. The device according to claim 1, wherein the second insulating film includes nitride.

6. The device according to claim 1, wherein, in a cross sectional view perpendicular to the first direction, a thickness of the second insulating film in the first direction is smaller than a thickness of the first insulating film in the first direction.

7. The device according to claim 1, wherein the second insulating film is provided on a side surface of the one of the stacked films, in a cross sectional view perpendicular to the first direction.

8. A semiconductor memory device, comprising:
    a first interconnect including tungsten extending in a first direction;
    a second interconnect including tungsten extending in the second direction crossing the first direction;
    a third interconnect including tungsten extending in the second direction, and the third interconnect being arranged apart from the second interconnect in the first interconnection;

a first layer including nitride being provided on the first interconnect, and the first layer extending in the first direction;

a first stacked film being provided between the first interconnect and the second interconnect in a third direction crossing to the first direction and the second direction, the first stacked film including a first variable resistance film;

a second stacked film being provided between the first interconnect and the third interconnect in the third direction, the second stacked film including a second variable resistance film;

a first insulating film being provide between the first stacked film and the second stacked film in the first direction, the first insulating film extending in the third direction; and a second insulating film including nitride, in a cross sectional view perpendicular to the first direction, the second insulating film being provided, between the first stacked film and the first insulating film in the first direction, between the first layer and the first insulating film in the third direction, and between the second stacked film and the first insulating film in the first direction.

9. The device according to claim 8, wherein the second insulating film is provided between the second interconnect and the first insulating film in the first direction, the second insulating film being provided between the third interconnect and the first insulating film in the first direction.

10. The device according to claim 8, wherein the first stacked film includes a first electrode provided between the second interconnect and the first variable resistance film in the third direction, the second stacked film further including a second electrode provided between the third interconnect and the second variable resistance film in the third direction.

11. The device according to claim 8, further comprising:
a second layer including nitride being provided on the first variable resistance film;
a third layer including nitride being connected to the first variable resistance film, the first variable resistance film being provided between the second layer and the third layer in the third direction;
a fourth layer including nitride being provided on the second variable resistance film; and
a fifth layer including nitride being connected to the second variable resistance film, the second variable resistance film being provided between the fourth layer and the fifth layer.

12. The device according to claim 8, wherein, in a cross sectional view perpendicular to the first direction, a thickness of the second insulating film in the first direction is smaller than a thickness of the first insulating film in the first direction.

13. The device according to claim 8, wherein the second insulating film is provided on a side surface of the first stacked films and a side surface of the second stacked films, in a cross sectional view perpendicular to the first direction.

14. A semiconductor memory device, comprising:
a plurality of first interconnects extending in a first direction, the first interconnects arranged in a second direction crossing to the first direction;

a plurality of second interconnects extending in the second direction, the second interconnects arranged in the first direction;

a layer being provided on one of the first interconnects, the layer including metal material and the layer extending in the first direction;

a plurality of stacked films respectively provided between the first interconnects and the second interconnects in a third direction crossing to the first direction and the second direction, the plurality of stacked films including a variable resistance film, the stacked films comprising films stacked in the third direction, the stacked films arranged in the first direction and the second direction;

a first insulating film including a first part and a plurality of first protrusions, the first part provided between the first interconnects adjacent to each other in the second direction, the first part extending in the first direction, the first protrusions provided between the stacked films adjacent to each other in the second direction, the first protrusions extending from the first part to the second interconnects in the third direction, the first protrusions arranged in the first direction; and a second insulating film provided on a periphery of the stacked films arranged in the second direction, the second insulating film separated from a portion between the stacked films adjacent to each other, the second insulating film including a second part and a plurality of second protrusions the second part extending in the first direction, the second protrusions extending from the second part to the second interconnects in the third direction, the second protrusions arranged in the first direction, a length of the second protrusions in the third direction being less than a length of the stacked films between the first interconnects and the second interconnects in the third direction.

15. The device according to claim 14, further comprising:
a third insulating film being provided between one of the second interconnects above the one of the stacked films and another one of the second interconnects above the another one of the stacked films in the first direction.

16. The device according to claim 15, wherein the third insulating film includes the nitride.

17. The device according to claim 15, wherein, in a cross sectional view perpendicular to the first direction, a thickness of the third insulating film in the first direction is smaller than a thickness of the first insulating film in the first direction.

18. The device according to claim 14, wherein the stacked films respectively include an electrode provided between the second interconnect and the variable resistance film.

19. The device according to claim 14, further comprising:
a second layer including nitride being provided on the variable resistance film; and
a third layer including nitride being connected to the variable resistance film, the variable resistance film being provided between the second layer and the third layer.

20. The device according to claim 14, further comprising:
a first contact being provided in a second insulating film in the third direction and contact with the second interconnect.

* * * * *